(12) United States Patent
Yang et al.

(10) Patent No.: US 10,985,795 B2
(45) Date of Patent: Apr. 20, 2021

(54) SWITCH ARRANGEMENT

(71) Applicant: NXP B.V., Eindhoven (NL)

(72) Inventors: Xin Yang, Eindhoven (NL); Mark Pieter van der Heijden, Eindhoven (NL); Gerben Willem de Jong, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/794,846

(22) Filed: Feb. 19, 2020

(65) Prior Publication Data
US 2020/0274575 A1    Aug. 27, 2020

(30) Foreign Application Priority Data

Feb. 27, 2019  (EP) ..................................... 19159726

(51) Int. Cl.
| | | |
|---|---|---|
| *H04B 1/44* | (2006.01) | |
| *H03H 11/28* | (2006.01) | |
| *H03K 17/567* | (2006.01) | |
| *H04L 5/16* | (2006.01) | |

(52) U.S. Cl.
CPC .............. *H04B 1/44* (2013.01); *H03H 11/28* (2013.01); *H03K 17/567* (2013.01); *H04L 5/16* (2013.01)

(58) Field of Classification Search
None
See application file for complete search history.

(56) References Cited

U.S. PATENT DOCUMENTS

| | | | |
|---|---|---|---|
| 5,193,218 A | 3/1993 | Shimo | |
| 8,922,450 B2 * | 12/2014 | Chen | H01Q 1/50 |
| | | | 343/859 |
| 9,042,844 B2 * | 5/2015 | Yu | H04B 1/44 |
| | | | 455/83 |
| 2002/0006810 A1 | 1/2002 | Schiller | |

(Continued)

OTHER PUBLICATIONS

Kibaroglu, K., "A Low-Cost Scalable 32-Element 28-GHz Phased Array Transceiver for 5G Communication Links Based on a 2 ⁺ 2 Beamformer Flip-Chip Unit Cell", IEEE Journal of Solid-State Circuits, IEEE 2018.

(Continued)

*Primary Examiner* — An T Luu

(57) ABSTRACT

A switch arrangement comprising:
  a transceiver node coupled to a first and second circuit branch, the first circuit branch including a transmit node, the second circuit branch including a receive node;
  wherein the first circuit branch comprises an inductor coupled in series and a first semiconductor switch, in parallel, configured to provide a switched coupling to a reference voltage; and
  wherein the second circuit branch comprises one of:
    i) a second and third semiconductor switch; and
    ii) a second semiconductor switch and a third semiconductor switch configured to control the application of a supply voltage to an amplifier; and
    iii) a further semiconductor switch configured to control the application of a bias current to an amplifier; wherein
  in the first switch mode, impedance matching between the transceiver node and transmit node is provided;
  in the second switch mode, impedance matching between the transceiver node and receive node is provided.

20 Claims, 8 Drawing Sheets

(56) References Cited

U.S. PATENT DOCUMENTS

2011/0285475 A1 11/2011 Lu et al.
2014/0065984 A1 3/2014 Wang et al.

OTHER PUBLICATIONS

Sadhu, B., "A 28-GHz 32-Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017.

* cited by examiner

SWITCH ARRANGEMENT

CROSS-REFERENCE TO RELATED APPLICATIONS

This application claims the priority under 35 U.S.C. § 119 of European Patent application no. 19159726.9, filed on 27 Feb. 2019, the contents of which are incorporated by reference herein.

FIELD

The present disclosure relates to a switch arrangement. In particular, it relates to a switch arrangement for switching between a receive path and a transmit path of a transceiver. It also relates to a corresponding method and communication device.

BACKGROUND

Communication devices, such as half-duplex communication devices, may include a switch arrangement to provide for selection of either a receive path or a transmit path. The switch arrangement may be part of RF front-end circuitry of the communication device.

SUMMARY

According to a first aspect of the present disclosure there is provided a switch arrangement comprising:
a transceiver node for coupling to a transceiver for receiving signalling for transmission and for providing received signalling based on the switch arrangement being in a first switch mode or a second switch mode, the transceiver node coupled to a first circuit branch and a second circuit branch, the first circuit branch including one of a transmit node for connection to a transmit path and a receive node for connection to receive path, the second circuit branch including the other of the transmit node and the receive node;
wherein the first circuit branch comprises an inductor coupled in series between the transceiver node and the one of the transmit node and the receive node, and a first semiconductor switch coupled to the one of the transmit node and the receive node and in parallel therewith, and the first semiconductor switch configured to provide a switched coupling to a reference voltage; and
wherein the second circuit branch comprises one of:
i) a second semiconductor switch coupled in series between the transceiver node and the other of the transmit node and the receive node, and a third semiconductor switch coupled to the other of the transmit node and the receive node and in parallel therewith; and
ii) a second semiconductor switch coupled in series between the transceiver node and the other of the transmit node and the receive node, an amplifier coupled to the other of the transmit node and the receive node, and a third semiconductor switch configured to control the application of a supply voltage to the amplifier to control the coupling of the other of the transmit node and the receive node to the reference voltage through the amplifier; and
iii) an amplifier coupled to the other of the transmit node and the receive node and a further semiconductor switch configured to control the application of a bias current to the amplifier to control the coupling of the other of the transmit node and the receive node to the reference voltage through the amplifier;
wherein, in the first switch mode, the first semiconductor switch is open and thereby configured to provide a capacitance in parallel with the inductor and the one of the second and third semiconductor switches or the further semiconductor switch are configured to provide a capacitance coupled in parallel between the inductor and the reference voltage for substantially providing for impedance matching between the transceiver node and the one of the transmit node and the receive node; and
wherein, in the second switch mode, the first semiconductor switch is closed and thereby couples the inductor and the one of the transmit node and the receive node to the reference voltage and the one of the second and third semiconductor switches or the further semiconductor switch are configured to couple the inductor, in parallel, to the reference voltage via a capacitance for substantially providing for impedance matching between the transceiver node and the other of the transmit node and the receive node.

In one or more examples, in the first switch mode, the third semiconductor switch may provide for coupling of the second branch with a reference voltage, which provides impedance mismatching between the transceiver node and the other of the transmit and receive nodes, and thereby allows for impedance matching over the first branch. In one or more examples, in the second switch mode, the first semiconductor switch may provide for coupling of the first branch with a reference voltage, which provides for impedance mismatching between the transceiver node and the one of the transmit node and the receive node, and thereby allows for impedance matching over the second branch.

In one or more examples the amplifier comprises a first terminal, a second terminal and a third terminal, wherein the first terminal is coupled to the third semiconductor switch as well as the other of the transmit node and the receive node, such as via a DC blocking capacitor, and wherein the second terminal is for coupling to the reference voltage and the third terminal is for coupling to a remainder of the other of the transmit path or receive path.

In one or more examples the amplifier comprises a first terminal, a second terminal and a third terminal, wherein the first terminal is coupled to a voltage supply node via an inductor as well as the other of the transmit node and the receive node, such as via a DC blocking capacitor, and wherein the second terminal is for coupling to the reference voltage and the third terminal is for coupling to a remainder of the other of the transmit path or receive path, wherein the bias current is applied at the third terminal.

In one or more embodiments, the second circuit branch is absent of an inductor.

In one or more examples, the second circuit branch is absent of an inductor between the transceiver node and the other of the transmit node and the receive node. In one or more examples, the second circuit branch is absent of an inductor in series between the transceiver node and the other of the transmit node and the receive node. In one or more examples, the switch arrangement is formed on an integrated circuit and the second circuit branch is absent of an inductor formed as part of the integrated circuit.

In one or more embodiments,
in the first switch mode, the semiconductor switches provide for formation of a CLC circuit in the first and second branches configured to substantially provide for impedance matching between the transceiver node and the one of the transmit node and the receive node: and in the second switch mode, the semiconductor switches provide for formation of a parallel LC tank circuit in the first and second branches configured to substantially provide for impedance matching between the transceiver node and the other of the transmit node and the receive node.

In one or more examples, the first semiconductor switch includes a node for providing a switched connection to the reference voltage. In one or more examples, the reference voltage is ground.

In one or more embodiments, the third semiconductor switch is configured to provide a switched connection to a reference voltage and wherein in the first mode, the third semiconductor switch is configured to be closed and in the second mode the third switch is configured to be open. In one or more examples, the third semiconductor switch includes a node for providing a switched connection to the reference voltage. In one or more examples, the reference voltage is ground.

In one or more embodiments, the third semiconductor switch comprises part of an amplifier arrangement, and the third semiconductor switch is configured to control the application of a supply voltage to an amplifier, wherein in the first mode the third switch is open and an amplifier of the amplifier arrangement is configured to provide a coupling to a reference voltage through the amplifier, and wherein, in the second mode, the third switch is closed and the amplifier is provided with the supply voltage.

In one or more embodiments, the amplifier arrangement comprises a series arrangement of a supply node for receiving the supply voltage, the third semiconductor switch configured to control the application of the supply voltage to the amplifier, comprising a npn transistor, through a further inductor, the npn transistor comprising a collector terminal coupled with the further inductor and an emitter terminal for connection to the reference voltage, the other of the transmit node and the receive node coupled between the further inductor and the collector terminal of the npn transistor, the amplifier arrangement further comprising a decoupling capacitor having a first plate coupled to a node between the third semiconductor switch and the inductor and a second plate for connection to the reference voltage.

In one or more embodiments, the switch arrangement includes, coupled to the other of the transmit node and the receive node, an amplifier arrangement comprises a series arrangement of a supply node for receiving a supply voltage, a further inductor, a npn transistor comprising a collector terminal coupled with the inductor and an emitter terminal for connection to the reference voltage, the other of the transmit node and the receive node coupled to a node between the inductor and the collector terminal via a DC blocking capacitor, the amplifier arrangement further comprising a bias circuit coupled to a base terminal of the transistor and configured to apply a bias current to the base terminal, the application of the bias current controlled by the further semiconductor switch;

wherein in the first switch mode the further semiconductor switch is open and the bias voltage is not applied to the base terminal; and wherein in the second switch mode the further semiconductor switch is closed and the bias voltage is applied to the base terminal.

In one or more embodiments, the first circuit branch comprises a transmit branch and couples to the transmit node;

the second circuit branch comprises a receive branch and couples to the receive node;

the first switch mode comprises a transmit mode which provides for impedance matching between transceiver node and the transmit node thereby providing for signalling to pass from the transceiver node to the transmit node; and the second switch mode comprises a receive mode which provides for impedance matching between transceiver node and the receive node thereby providing for signalling to pass from the receive node to the transceiver node.

In one or more examples, the switch arrangement comprises a quarter wavelength single-pole, double-throw switch arrangement.

In one or more embodiments, the switch arrangement comprises a differential switch arrangement, and the transceiver node comprises a positive transceiver node and a negative transceiver node, the transmit node comprises a positive transmit node and a negative transmit node, and the receive node comprises a positive receive node and a negative receive node;

wherein the first circuit branch comprises a first positive circuit branch and a first negative circuit branch coupled to the respective positive and negative transmit nodes, and wherein the inductor comprises a first inductor in the first positive circuit branch and a second inductor in the first negative circuit branch, the first inductor coupled in series between the positive transceiver node and the positive transmit node and the second inductor coupled in series between the negative transceiver node and the negative transmit node, and the first semiconductor switch is in parallel with both the positive transmit node and the negative transmit node; and wherein the second circuit branch comprises a second positive circuit branch and a second negative circuit branch coupled to the respective positive and negative receive nodes, and wherein the second semiconductor switch comprises a pair of switches comprising a second-positive semiconductor switch and a second-negative semiconductor switch, the second positive circuit branch includes the second-positive semiconductor switch coupled in series between the positive transceiver node and the positive receive node and the second negative circuit branch includes the second-negative semiconductor switch coupled in series between the negative transceiver node and the negative receive node, and the third semiconductor switch is in parallel with both the positive receive node and the negative receive node.

In one or more embodiments, one of:

the first semiconductor switch comprises a pair of first semiconductor switches, and a first of the pair is configured to provide a switched connection to a reference voltage for the first positive circuit branch and a second of the pair is configured to provide a switched connection to the reference voltage for the first negative circuit branch; and the first semiconductor switch is configured to provide a switched connection configured to couple the first positive circuit branch and the first negative circuit branch.

In one or more embodiments, one of:

the third semiconductor switch comprises a pair of third semiconductor switches each of the pair configured to provide a switched connection to a reference voltage for each of the second positive circuit branch and the second negative circuit branch; and the third semiconductor switch is configured to provide a switched connection between the second positive circuit branch and the second negative circuit branch.

In one or more embodiments, the first semiconductor switch and the third semiconductor switch comprise one of:

a MOS transistor having a drain terminal coupled to the respective transmit node and the receive node and a source terminal for connection to a reference voltage;

a reverse saturation mode npn transistor having a collector terminal coupled to the respective transmit node and the receive node and an emitter terminal for connection to a reference voltage;

a forward saturation mode npn transistor having an emitter terminal coupled to the respective transmit node and the receive node and a collector terminal for connection to a reference voltage; and a pin diode having a cathode thereof coupled to the respective transmit node and the receive node and an anode thereof coupled to a reference voltage via a capacitor.

In one or more examples, the second, series, semiconductor switch comprises one of:

a MOS transistor having a drain terminal coupled to the second branch via a capacitor and a source terminal coupled to the second branch via a capacitor and a gate terminal, the source, drain and gate terminals configured to receive respective control signals for controlling the switch;

a npn transistor having a collector terminal coupled to the second branch via a capacitor and an emitter terminal coupled to the second branch via a capacitor and a base terminal, the collector, emitter and base terminals configured to receive respective control signals for controlling the switch; and a diode having a cathode coupled to the second branch via a capacitor, an anode coupled to the second branch via a capacitor and the anode and cathode configured to receive respective control signals for controlling the switch.

In one or more embodiments, the switch arrangement is formed as an integrated circuit on a semiconductor die wherein the transceiver node, the transmit node and the receive node provide for connection to and from the semiconductor die.

According to a second aspect of the present disclosure there is provided a method of operating a switch arrangement, the switch arrangement comprising:

a transceiver node for coupling to a transceiver for receiving signalling for transmission and for providing received signalling based on the switch arrangement being in a first switch mode or a second switch mode, the transceiver node coupled to a first circuit branch and a second circuit branch, the first circuit branch including one of a transmit node for connection to a transmit path and a receive node for connection to receive path, the second circuit branch including the other of the transmit node and the receive node;

wherein the first circuit branch comprises an inductor coupled in series between the transceiver node and the one of the transmit node and the receive node, and a first semiconductor switch coupled to the one of the transmit node and the receive node and in parallel therewith, and the first semiconductor switch configured to provide a switched coupling to a reference voltage; and wherein the second circuit branch comprises one of:

i) a second semiconductor switch coupled in series between the transceiver node and the other of the transmit node and the receive node, and a third semiconductor switch coupled to the other of the transmit node and the receive node and in parallel therewith; and ii) a second semiconductor switch coupled in series between the transceiver node and the other of the transmit node and the receive node, an amplifier coupled to the other of the transmit node and the receive node, and a third semiconductor switch configured to control the application of a supply voltage to the amplifier to control the coupling of the other of the transmit node and the receive node to the reference voltage through the amplifier, via a capacitor; and iii) an amplifier coupled to the other of the transmit node and the receive node and a further semiconductor switch configured to control the application of a bias current to the amplifier to control the coupling of the other of the transmit node and the receive node to the reference voltage through the amplifier;

wherein the method comprises adopting a first switch mode in which the first semiconductor switch is open and thereby configured to provide a capacitance in parallel with the inductor and the one of the second and third semiconductor switches or the further semiconductor switch are configured to provide a capacitance coupled in parallel between the inductor and the reference voltage for substantially providing for impedance matching between the transceiver node and the one of the transmit node and the receive node; and wherein the method comprises adopting a second switch mode in which the first semiconductor switch is closed and thereby couples the inductor and the one of the transmit node and the receive node to the reference voltage and the one of the second and third semiconductor switches or the further semiconductor switch are configured to couple the inductor, in parallel, to the reference voltage via a capacitance for substantially providing for impedance matching between the transceiver node and the other of the transmit node and the receive node.

According to a third aspect of the present disclosure there is provided communication device including the switch arrangement the first aspect including one or more antennas coupled to the transmit node and receive node via one or more amplifiers and a signal processing element for providing communication functionality coupled to the transceiver node, the switching modes operable to provide for half-duplex transmission and reception of signalling by the communication device.

According to a fourth aspect of the present disclosure there is provided a switch arrangement comprising:

a transceiver node for coupling to a transceiver for receiving signalling for transmission and for providing received signalling based on the switch arrangement being in a first switch mode or a second switch mode, the transceiver node coupled to a first circuit branch and a second circuit branch, the first circuit branch including one of a transmit node for connection to a transmit path and a receive node for connection to receive path, the second circuit branch including the other of the transmit node and the receive node;

wherein the first circuit branch comprises an inductor coupled in series between the transceiver node and the one of the transmit node and the receive node, and a first semiconductor switch coupled to the one of the transmit node and the receive node and in parallel therewith, and the first semiconductor switch configured to provide a switched coupling to a reference voltage; and wherein the second circuit branch comprises one of;
i) a second semiconductor switch coupled in series between the transceiver node and the other of the transmit node and the receive node, and a third semiconductor switch coupled to the other of the transmit node and the receive node and in parallel therewith; and
ii) a second semiconductor switch coupled in series between the transceiver node and the other of the transmit node and the receive node, an amplifier coupled to the other of the transmit node and the receive node, and a third semiconductor switch configured to control the application of a supply voltage to the amplifier to control the coupling of the other of the transmit node and the receive node to the reference voltage through the amplifier; and
iii) an amplifier coupled to the other of the transmit node and the receive node and a further semiconductor switch configured to control the application of a bias current to the amplifier to control the coupling of the other of the transmit node and the receive node to the reference voltage through the amplifier;

wherein, in the first switch mode, the switches are configured to provide a CLC network to provide impedance matching between the transceiver node and the one of the transmit node and the receive node; and wherein, in the second switch mode, the switches are configured to provide a parallel LC tank network to provide impedance matching between the transceiver node and the other of the transmit node and the receive node.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Switch arrangements may be used in a variety of electronic devices, such as half-duplex communication devices. The switch arrangement may be used in or outside the field of communication devices to provide a substantially impedance matched path to a first node and not to a second node in a first switch mode and to provide a substantially impedance matched path to the second node and not the first node in a second switch mode. Thus, the switch arrangement may provide a selectable coupling, such as in terms of preferential impedance matching, between a receive path in which signalling is received and provided to a transceiver node and a transmit path in which signalling from the transceiver node is provided to the transmit path. However, in more general terms, the switch arrangement may provide for selection (i.e. coupling to) of either a receive path or a transmit path with respect to the transceiver node. The switch arrangement may be part of RF front-end circuitry of a communication device. The present disclosure describes various embodiments of switch arrangements of single-pole, double-throw type (SPDT). The present disclosure describes various embodiments of switch arrangements of quarter wavelength type.

Figure 1:
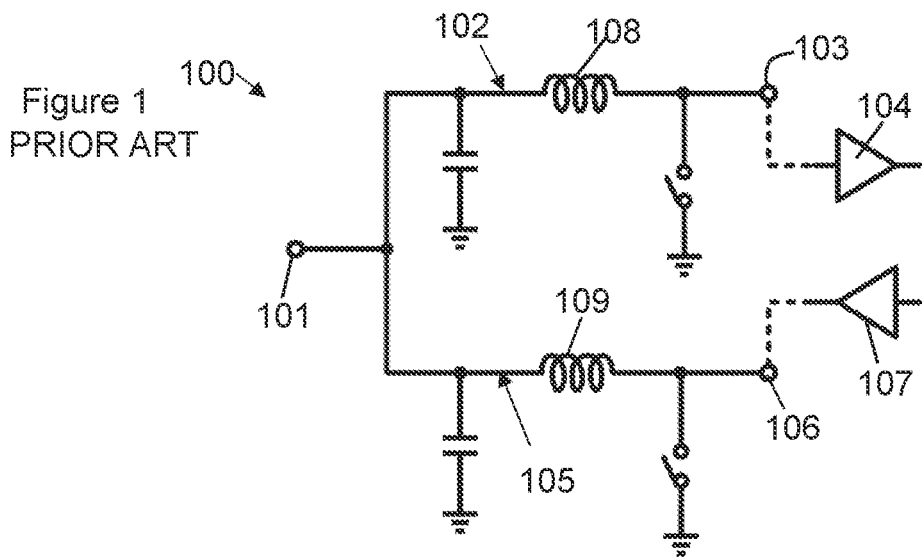
FIG. 1 shows a first example known switch arrangement.
Figure 2:
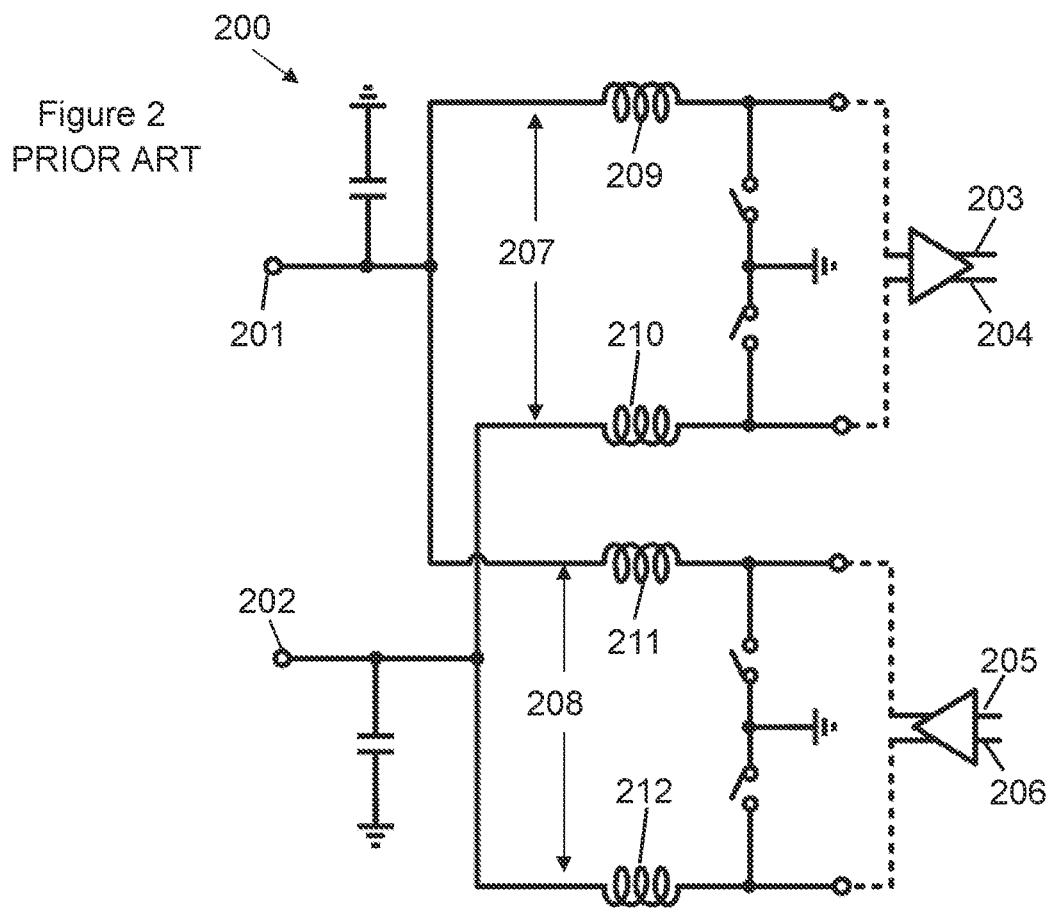
FIG. 2 shows a second example known switch arrangement.

Known quarter wavelength SPDT switch arrangements are shown in FIG. 1 and FIG. 2. The known switch arrangement 100 of FIG. 1 comprises a transceiver node 101 via which signalling for transmission and received signalling is passed. The arrangement 100 comprises a transmit branch 102 which couples the transceiver node 101 to a transmit node 103. The transmit node 103 typically couples to an amplifier 104 for onward transmission of the signalling passed through the transmit branch 102. The arrangement 100 further comprises a receive branch 105 which couples the transceiver node 101 to a receive node 106. The receive node 106 typically couples to an amplifier 107 for amplification of received signalling received by the amplifier 107 for passing through the receive branch to the transceiver node 101. The transmit branch 102 and the receive branch 105 both include at least one inductor 108, 109. Accordingly, the arrangement 100 includes at least two inductors. The transmit branch 102 and the receive branch 105 both include switches 110, 111. The operation of the switches 110, 111 provides for selection of one of the receive path 102 and the transmit path 105 in terms of preferential impedance matching between the transceiver node 101 and the respective transmit or receive node 103, 106.

The known switch arrangement 200 of FIG. 2 is substantially similar to FIG. 1 except that FIG. 2 shows a known differential quarter wavelength SPDT switch arrangement 200. Thus, the transceiver node comprises positive and negative transceiver nodes 201, 202 and the transmit node comprises positive and negative transmit nodes 203, 204 and the receive node comprises positive and negative receive nodes, 205, 206. The transmit path 207 further comprises a pair of transmit paths and the receive path 208 comprises a pair of receive paths. The pair of transmit paths each include an inductor. The pair of receive paths each include an inductor 209-212. Thus, the known differential quarter wavelength SPDT switch arrangement 200 includes at least four inductors.

Such switch arrangements may be embodied as integrated circuits. The inductors 108, 109, 209, 210, 211, 212 may be area intensive on an integrated circuit's die.

Figure 3:
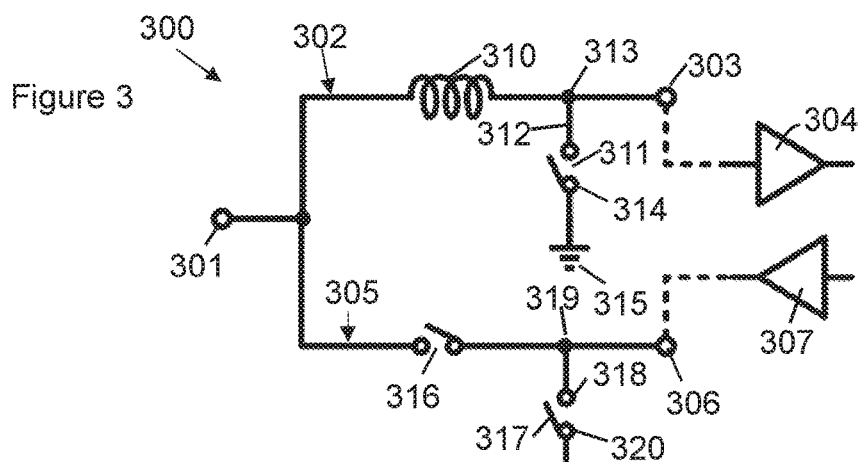
FIG. 3 shows an example embodiment of a switch arrangement.

FIG. 3 shows an example embodiment comprising a switch arrangement 300. The switch arrangement 300 may comprise a switch arrangement of quarter wavelength SPDT type. The switch arrangement 300 comprises a transceiver node 301 via which signalling for transmission and received signalling is passed. The arrangement 300 comprises a first branch, which in this example is a transmit branch 302, which couples the transceiver node 301 to a transmit node 303. The transmit node 303 typically couples to an amplifier 304, such as directly or via other components, for onward transmission of the signalling passed through the transmit branch 302. The arrangement 300 further comprises a second branch, which in this example is a receive branch 305, separate from the transmit branch and in parallel therewith. The receive branch 305 couples the transceiver node 301 to a receive node 306. The receive node 306 typically couples to an amplifier 307 for amplification of received signalling received by the amplifier 307 for passing, such as directly or via other components, through the receive node 306 and the receive branch 305 to the transceiver node 301. The transmit branch 302 and the receive branch 305, in this and one or more examples, extend from the transceiver node 301, such as directly from the transceiver node 301.

It will be appreciated that in other examples, the first branch may comprise the receive branch and the second branch may comprise the transmit branch and thus the branches may couple to the other of the transmit node and receive node.

The switch arrangement 300 (or any of the example switch arrangements described herein) may be integrated in an integrated circuit. The transceiver node 301 and the transmit node 303 and the receive node 306 may represent the connections to/from the integrated circuit. Accordingly, the amplifiers 304, 307, in one or more examples, may be external to the integrated circuit and therefore the switch arrangement 300. In other examples, the amplifiers 304, 307 or amplifier arrangements (described later) may be part of the switch arrangement 300 and may or may not be part of the integrated circuit.

The switch arrangement 300 provides for selection of the transmit branch 302 or the receive branch such that the transceiver node 301 may receive signalling from outside the switch arrangement 300 for transmission via the transmit branch 302 and the transmit node 303 and, at a different time, such that the transceiver node 301 may receive received signalling from the receive node 306 via the receive branch 305. The switch arrangement 300 may provide for said selection based on the switch arrangement 100 being in a first switch mode or a second switch mode.

In one or more examples, the first or transmit circuit branch 302 comprises an inductor 310 coupled in series between the transceiver node 301 and the transmit node 303. In one or more examples, the inductor 310 may be coupled directly to the transceiver node in the transmit branch, i.e. with no intervening electrical components, or with one or more electrical components therebetween. The first or transmit branch 302 includes a first semiconductor switch 311 coupled to the transmit node 303 and in parallel therewith. Thus, a first terminal 312 of the first semiconductor switch 311 may be coupled to a node 313 between the inductor 310 and the transmit node 303 and a second terminal 314 of the first semiconductor switch 311 may be coupled to none, one or more further components. Although nodes 313 and 303 are shown separately in the diagram it will be appreciated that in practice they could be the same node. In one or more examples, said second terminal 314 is for coupling or is coupled to a reference voltage, such as ground 315. Thus, the second terminal 314 may be coupled to a node that is for coupling to a reference voltage when the switch arrangement is in use. In this and one or more examples, the first semiconductor switch 311 may be coupled directly to the inductor 310, such as without a capacitor and/or further inductor therebetween. Independently, in this and one or more examples, the first semiconductor switch 311 may be coupled directly to the transmit node 303, such as without a capacitor and/or further inductor and/or other component therebetween. The first semiconductor switch 311 may therefore provide a switched connection to the reference voltage 315. The first semiconductor switch 311 may be considered a first shunt switch. The state of the first semiconductor switch 311, i.e. open or closed, may be controlled by a control signal applied at a control terminal of the first semiconductor switch 311.

In one or more examples, the second or receive circuit branch 305 comprises a second semiconductor switch 316 coupled in series between the transceiver node 301 and the receive node 306. In one or more examples, the second semiconductor switch 316 may be coupled directly to the transceiver node 301 i.e. with no intervening electrical components in the receive branch, or with one or more electrical components therebetween. The second or receive circuit branch 305 comprises a third semiconductor switch 317 (e.g. a second shunt switch) coupled to the receive node 306 and in parallel therewith. Thus, a first terminal 318 of the third semiconductor switch 317 may be coupled to a node 319 between the second semiconductor switch 316 and the receive node 306 and a second terminal 320 of the third semiconductor switch 317 may be coupled to none, one or more further components. In one or more examples, said second terminal 320 is for coupling or is coupled to a reference voltage, such as ground 315. Thus, the second terminal 320 may be coupled to a node that is for coupling to a reference voltage when the switch arrangement is in use. In this and one or more examples, the third semiconductor switch 317 may be coupled directly to the inductor 310, such as without a capacitor and/or further inductor therebetween. Independently, in this and one or more examples, the third semiconductor switch 317 may be coupled directly to the transmit node 303, such as without a capacitor and/or further inductor and/or other component therebetween. The state of the second semiconductor switch 316 or the third semiconductor switch, i.e. open or closed, may be controlled by a control signal applied at a control terminal of the second or third semiconductor switch 316, 317.

The operation of the first, second and third semiconductor switches 311, 316 and 317 may provide for selection of one of the receive path 302 and the transmit path 305 in terms of preferential impedance matching between the transceiver node 301 and the respective transmit or receive node 303, 306.

Thus, in the first switch mode, the switch arrangement 300 may substantially provide an impedance matched path between the transceiver node 301 and the transmit node 303 but not between the transceiver node 301 and the receive node 306, such that the switch arrangement provides a signal path between the transceiver node 301 and the transmit node 303. Thus, in the second switch mode, the switch arrangement 300 may substantially provide an impedance matched path between the transceiver node 301 and the receive node 306 but not between the transceiver node 301 and the transmit node 301, such that the switch arrangement provides a signal path between the transceiver node 301 and the receive node 306.

In this and one or more other examples, in the first switch mode, the first semiconductor switch 311 and the second semiconductor switch 316 are open. As the semiconductor switches are semiconductor based, and may comprise one of a transistor arrangement or biased diode arrangement, they have an intrinsic capacitance in the open state, sometimes termed the parasitic capacitance. The first semiconductor switch 311 and the second semiconductor switch 316, in the first switch mode, thereby provide a capacitance in the switch arrangement 300.

In this and one or more other examples, in the first switch mode, the third semiconductor switch 317 is closed and therefore configured to provide a connection from the receive branch 305 to the reference voltage 315, such as ground.

Figure 4:
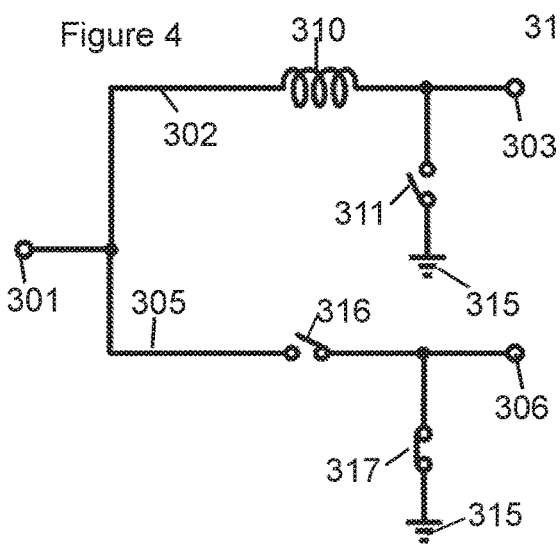
FIG. 4 shows the switch arrangement of FIG. 3 in a first switch mode.

Example FIG. 4 shows the state of the first, second and third semiconductor switches 311, 316 and 317 in the first switch mode. In the open state, the semiconductor switches may be considered to present a capacitance to the switch arrangement. In the closed state, the semiconductor switches may be considered to present a resistance to the switch arrangement. Thus, in this and in one or more examples, in the first switch mode, the state of the semiconductor switches are configured to present a CLC network between the transceiver node 301 and the transmit node 303.

The CLC network provides for the impedance matching between the transceiver node 301 and the one of the transmit node 303 and receive node 306 (in this embodiment the transmit node). The other of the transmit node 303 and the receive node 306 (in this embodiment the receive node) is shorted to the reference voltage by the closed third semiconductor switch 317. Accordingly, the impedance at the transceiver node 301 is not matched (i.e. mismatched) to the impedance at the receive node 306.

Figure 5:
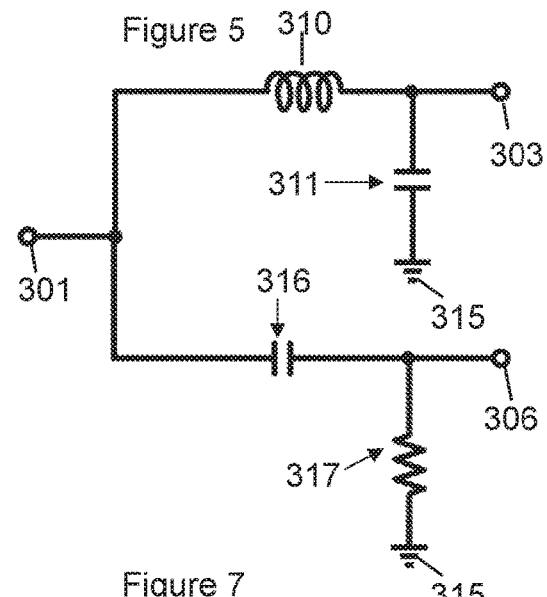
FIG. 5 shows the equivalent circuit of the switch arrangement of FIG. 3 in the first switch mode.

Example FIG. 5 shows the first, second and third semiconductor switches 311, 316, 317 in the first switch mode replaced with the capacitor and resistor symbols to show an equivalent model of the switches in the first switch mode of the switch arrangement 300. The CLC network is provided by the capacitance 311 coupled to the reference voltage, the inductor 310 and the capacitance 317 connected to the reference voltage.

Figure 6:
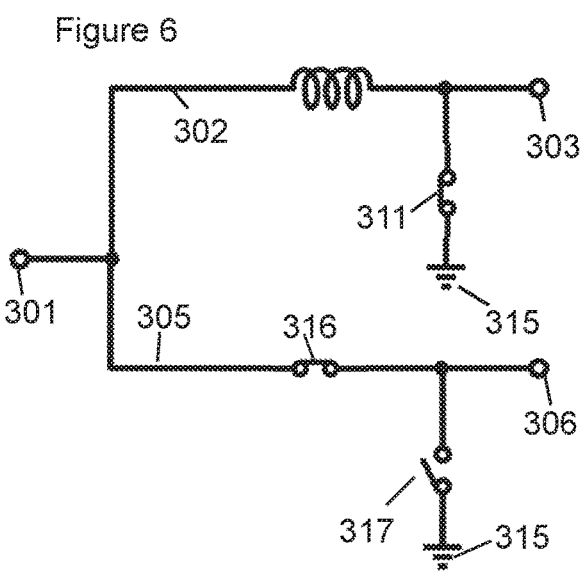
FIG. 6 shows the switch arrangement of FIG. 3 in a second switch mode.

With reference to example FIG. 6, in the second switch mode, the first semiconductor switch 311 and the second semiconductor switch 316 are closed. As the first semiconductor switch 311 is closed it is therefore configured to provide a connection from the transmit branch 302 to the reference voltage 315. In the closed state, the first semiconductor switch 311 may be considered to present a resistance in the switch arrangement. In one or more examples, in the second switch mode, the second semiconductor switch 316 is closed. The second semiconductor switch 316 therefore provides a direct coupling between the transceiver node 301 and the receive node 306.

In this and one or more other examples, in the second switch mode, the third semiconductor switch is configured to be open and therefore presents a capacitance in parallel with the receive node 306. Thus, in this and in one or more examples, in the second switch mode, the state of the switches 311, 316, 317 provide for a parallel LC tank circuit that provides for the impedance matching between the transceiver node 301 and the other of the transmit node 303 and receive node 306 (in this embodiment the receive node). In this and other examples, the arrangement is configured such that the inductor 310 tunes out the capacitance of the open first switch 317 to provide said impedance matching. The one of the transmit node 303 and the receive node 306 (in this embodiment the transmit node) is shorted to the reference voltage by the closed first semiconductor switch 311. Accordingly, the impedance at the transceiver node 301 is not matched (i.e. mismatched) to the impedance at the transmit node 303.

Figure 7:
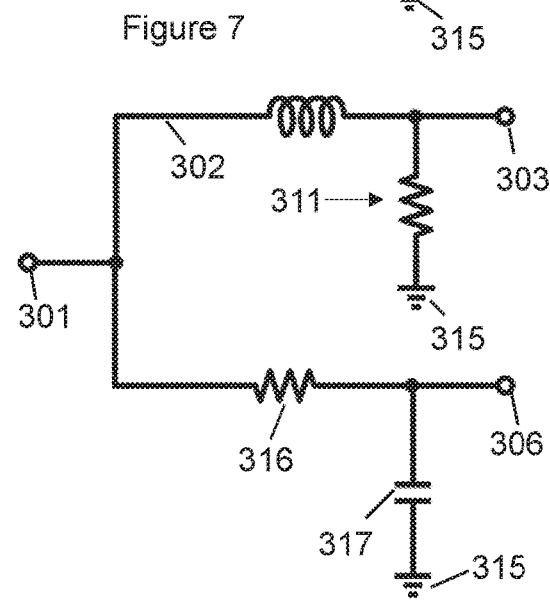
FIG. 7 shows the equivalent circuit of the switch arrangement of FIG. 3 in the second switch mode.

Example FIG. 7 shows the first, second and third semiconductor switches 311, 316, 317 in the second switch mode replaced with the capacitor and resistor symbols to show an equivalent model of the switches in the switch arrangement 300. Thus, in this and in one or more examples, in the second switch mode, the state of the semiconductor switches are configured to present a parallel LC tank network between the transceiver node 301 and the receive node 306.

In one or more examples, the second or receive circuit branch is absent of an inductor. In particular, the second circuit branch 305 is absent of an inductor between the transceiver node 301 and the receive node 306. Compared to the known arrangement of FIG. 1, there is half the number of inductors and therefore the switch arrangement of example FIGS. 3 to 7 may be considered area efficient and may be of lesser size than that of FIG. 1.

With reference to the equivalent model of FIG. 5, the inductor 310 may have inductance L and, in the first switch mode, the first semiconductor switch 311 may have a capacitance $C_{off1}$, the second semiconductor switch 316 may have a capacitance $C_{off2}$ and the third semiconductor switch may have a resistance $R_{on3}$. We also assume that the interface impedance of the transceiver node is $Z_0$ ($Z_0$ is usually 50Ω). The first, second and third semiconductor switches therefore provide a CLC network comprising, respectively, the shunt capacitance Coff1, the series inductance L, and the shunt capacitance Coff2. The CLC network, in the first switch mode should transform impedance from $Z_0$ to $Z_0$. $R_{on3}$, the resistance of the third semiconductor switch in the on state, may be treated as Q-factor degeneration of $C_{off2}$. Then we can say that:

$$\cfrac{1}{\cfrac{1}{\cfrac{1}{Z_0}+j\omega C_{off1}}+j\omega L} + j\omega C_{off2} = \frac{1}{Z_0}$$

And, accordingly, $$C_{off1} = C_{off2} \quad (1)$$

And $$L = \cfrac{2C_{off1}}{\cfrac{1}{Z_0^2}+\omega^2 C_{off1}^2}$$

wherein $\omega=2\pi f$ and f is the intended operational frequency of the switch arrangement 300.

With reference to the equivalent model of FIG. 7, the inductor 310 still has an inductance L and, in the second switch mode, the first semiconductor switch 311 may have a resistance $R_{on1}$, the second semiconductor switch 316 may have a resistance $R_{on2}$ and the third semiconductor switch may have a capacitance $C_{off3}$. Again, we assume that the interface impedance of the transceiver node is $Z_0$ ($Z_0$ is usually 50Ω). The first, second and third semiconductor switches therefore provide a parallel LC tank network with the inductor 310 comprising the shunt inductance L and the shunt capacitance $C_{off3}$. The LC network, formed in the second switch mode, should transform impedance from $Z_0$ to $Z_0$. L and $C_{off3}$ may be configured to resonate at the operational frequency. $R_{on1}$ and $R_{on2}$ may be treated as Q-factor degeneration. Then we can say that:

$$\omega^2 C_{off3} L = 1$$

In one or more examples, the first and second semiconductor switches may be configured to present the same capacitance in the off state and thus, $$C_{off2} = C_{off1}$$

As determined above:

$$L = \cfrac{2C_{off1}}{\cfrac{1}{Z_0^2}+\omega^2 C_{off1}^2}$$

And it can be shown that:

$$C_{off3} = \frac{1}{2\omega^2 Z_0^2 C_{off1}^2} + \frac{C_{off1}}{2}$$

In one or more examples, the first and second semiconductor switches may be configured to present the same capacitance in the off state as the third semiconductor switch in the off-state and thus:

$$C_{off1} = C_{off2} = C_{off3}$$

From the equations above the LC values may be simplified to a specific case which is more practical for circuit tuning and implementation, such that:

$$C_{off1} = C_{off2} = C_{off3} = \frac{1}{\omega Z_0} \quad (2)$$

And $$L = \frac{Z_0}{\omega}$$

Thus, the value of the inductor 310 may be determined using the above equation 2 and then the value of the capacitances may be determined using equation 1. It will be appreciated that these equations represent a simplified case and therefore the inductances and capacitances may be determined differently.

It will be appreciated that in one or more examples the semiconductor switches 311, 316, 317 are configured present a resistance in the on/closed state and a capacitance in the off/open state. It will also be appreciated that there are many possible arrangements of semiconductor switch that exhibit these properties. Example FIGS. 8 to 11 show four of many possible configurations for such a semiconductor switch.

It will be appreciated that in one or more other examples, the first switch mode may comprise a receive mode or a transmit mode and the second switch mode may comprise the other of a receive mode or a transmit mode depending on the configuration of the first and second branches as transmit or receive branches.

Figure 8:
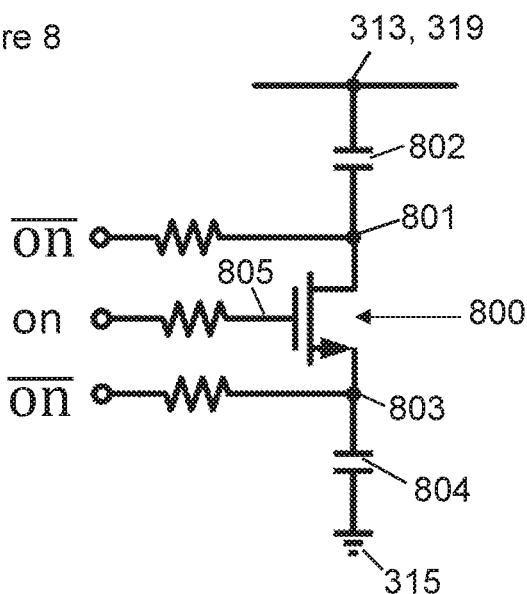
FIG. 8 shows a first example embodiment of a semiconductor switch.

Example FIG. 8 shows a semiconductor switch 311 and 317 comprising a MOS transistor, such as an n-channel MOSFET 800. The MOSFET 800 comprises a drain terminal 801 coupled to a first capacitor 802 and a source terminal 803 coupled to a second capacitor 804. For the first semiconductor switch and the third semiconductor switch, the drain terminal 801 is coupled to the respective transmit node 303 and the receive node 306 via the first capacitor 802. For the first semiconductor switch and the third semiconductor switch, the source terminal 803 is coupled to or for coupling to the reference voltage, such as ground 315, via the second capacitor 804. The state of the semiconductor switch, i.e. open or closed, is, in this example, controlled by a control signal comprising a first, second and third control signal respectively applied at each of the drain terminal 801, a gate terminal 805 of the MOSFET and the source terminal 803 (in this example each via a resistor). In particular, the semiconductor switch is open/off when the first and third control signals are low and the second control signal is high. The semiconductor switch is closed/on when the first and third control signals are high and the second control signal is low.

Figure 9:
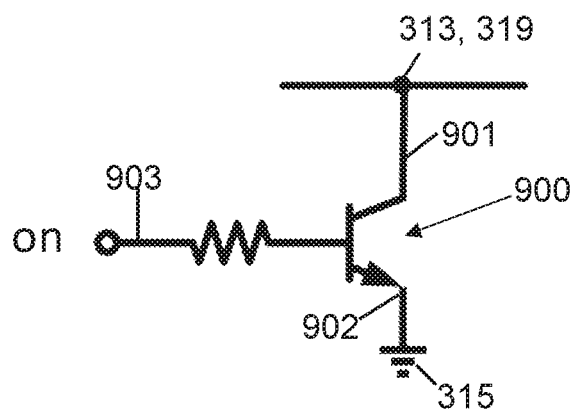
FIG. 9 shows a second example embodiment of a semiconductor switch.

Example FIG. 9 shows a bipolar junction transistor (BJT) 900 of npn type. For the first semiconductor switch and the third semiconductor switch, a collector terminal 901 is coupled to the respective transmit node 303 and the receive node 306. An emitter terminal 902 is for coupling to a reference voltage, such as ground. The state of the semiconductor switch, i.e. open or closed, is, in this example, controlled by a control signal applied at the base terminal 903 via a resistor. Application of a voltage at the base terminal provides the closed or on state for the switch.

Figure 10:
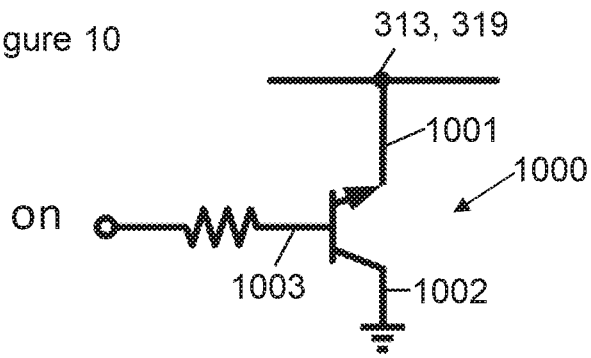
FIG. 10 shows a third example embodiment of a semiconductor switch.

Example FIG. 10 shows a forward saturation mode npn BJT transistor 1000. For the first semiconductor switch and the third semiconductor switch, an emitter terminal 1001 coupled to the respective transmit node and the receive node and a collector terminal 1002 for coupling to the reference voltage 315. The state of the semiconductor switch, i.e. open or closed, is, in this example, controlled by a control signal applied at the base terminal 1003 via a resistor. Application of a voltage at the base terminal provides the closed or on state for the switch.

Figure 11:
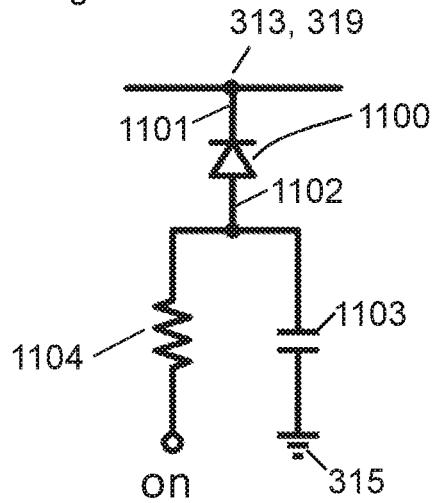
FIG. 11 shows a fourth example embodiment of a semiconductor switch.

Example FIG. 11 shows a pin diode 1100. For the first semiconductor switch and the third semiconductor switch, a cathode 1101 thereof is coupled to the respective transmit node and the receive node and an anode 1102 thereof is for coupling to the reference voltage 315 via a capacitor 1103. The state of the semiconductor switch, i.e. open or closed, is, in this example, controlled by a control signal applied at the anode 1102 via a resistor 1104. Application of a voltage at the anode 1102 biases the diode and provides the closed or on state for the switch.

Example FIGS. 21 to 24 show embodiments of the series arranged second semiconductor switch 316. The examples of FIGS. 21 to 23 have a similar configuration. The example of FIG. 21 comprises a MOS transistor 2100, such as an n-channel MOSFET. The MOSFET 2100 comprises a drain terminal 2101 coupled to a first capacitor 2102 and a source terminal 2103 coupled to a second capacitor 2104. The drain terminal 2101 is coupled to the transceiver node 301 via the first capacitor 2102. The source terminal 2103 is coupled to the other of the transmit node and receive node, which in this example comprises the receive node, via the second capacitor 2104. The state of the semiconductor switch, i.e. open or closed, is, in this example, controlled by a control signal comprising a first, second and third control signal respectively applied at each of the drain terminal 2101, a gate terminal 2105 of the MOSFET and the source terminal 2103 (in this example each via a resistor). In particular, the semiconductor switch is open/off when the first and third control signals are low and the second control signal is high. The semiconductor switch is closed/on when the first and third control signals are high and the second control signal is low.

Figure 22:
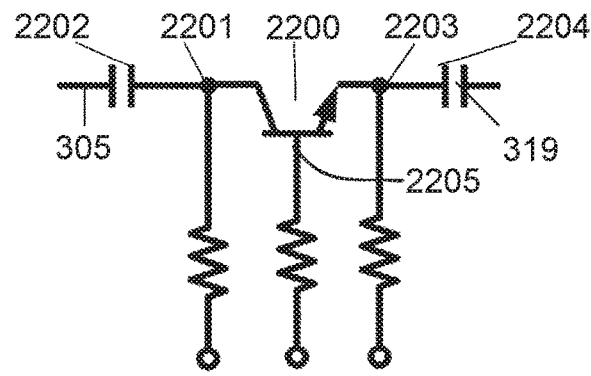
FIG. 22 shows a second example embodiment of a second semiconductor switch.
Figure 23:
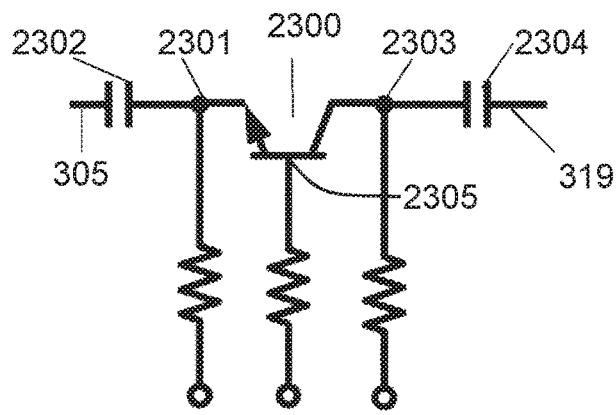
FIG. 23 shows a third example embodiment of a second semiconductor switch.

Example FIGS. 22 and 23 show a similar arrangement using a BJT 2200, 2300 rather than the MOSFET 2100. Example FIGS. 22, 23 show a bipolar junction transistor (BJT) 2200, 2300 of npn type. A collector terminal 2201, 2303 is coupled to either the transceiver node 301 or the one of the transmit node and receive node via capacitor 2304, 2202. An emitter terminal 2203, 2301 is coupled to the other of either the transceiver node 301 and the one of the transmit node and receive node via a capacitor 2302, 2204. The state of the semiconductor switch 2205, 2305, i.e. open or closed, is, in this example, controlled by a first control signal applied at the base terminal 2205, 2305 via a resistor as well as separate second and third control signals at the collector and emitter terminals, applied via resistors. Application of a high voltage at the base terminal provides the closed or on state for the switch while the second and third control signals are low. A low first control signal with high second and third control signals provides the open or off state.

Figure 24:
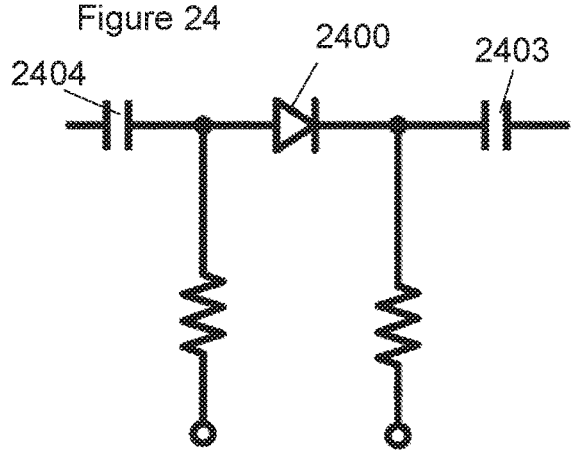
FIG. 24 shows a fourth example embodiment of a second semiconductor switch.

Example FIG. 24 shows a diode 2400. For the first semiconductor switch and the third semiconductor switch, a cathode 2401 thereof is coupled to the respective transmit node and the receive node and an anode 1102 thereof is coupled to the transceiver node 301, both via a capacitor 2403, 2404. The state of the semiconductor switch, i.e. open or closed, is, in this example, controlled by a first control signal applied at the anode via a resistor and a second control signal applied at the cathode via a resistor. A high voltage at the anode and a low voltage at the cathode biases the diode and provides the closed or on state for the switch. A low voltage at the anode and a high voltage at the cathode provides the open or off state for the switch.

Figure 12:
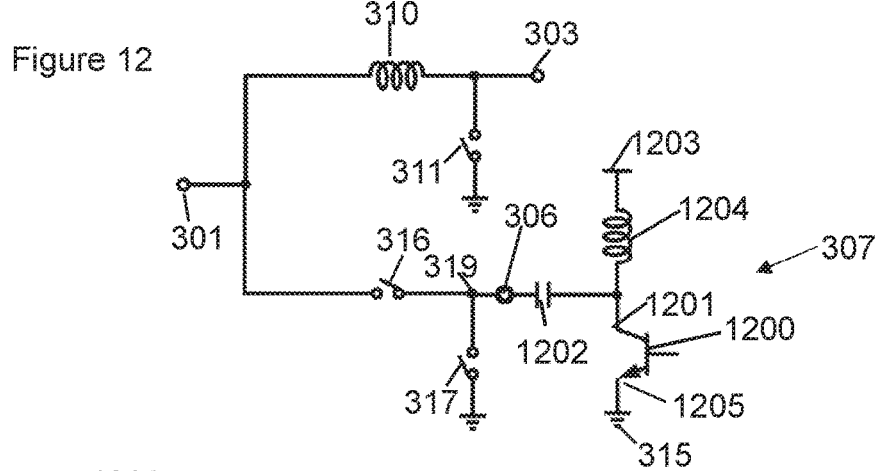
FIG. 12 shows the example embodiment of FIG. 3 with the receive amplifier shown in more detail.

Example FIG. 12 shows the same switch arrangement as example FIG. 3 expect that the amplifier 307 is shown in more detail. In one or more examples, the amplifier 307 comprises a receive path buffer amplifier. In particular, the amplifier 307 comprises a transistor, such as a bipolar junction transistor (BJT) 1200 of npn type. The amplifier/transistor is coupled with further ancillary components. In particular, a collector terminal 1201 is coupled to the receive node 306, such as via a DC blocking capacitor 1202. The capacitor 1202 may be ignored when considering the coupling of an RF signal between the transceiver node and the transistor 1200. The collector terminal 1201 is further coupled, in parallel, with a power supply node 1203 via an inductor 1204. The power supply node 1203 is for connection to a power supply. An emitter terminal 1205 is for coupling to the reference voltage, such as ground 315. The remainder of the receive path may connect to the base terminal.

Figure 13:
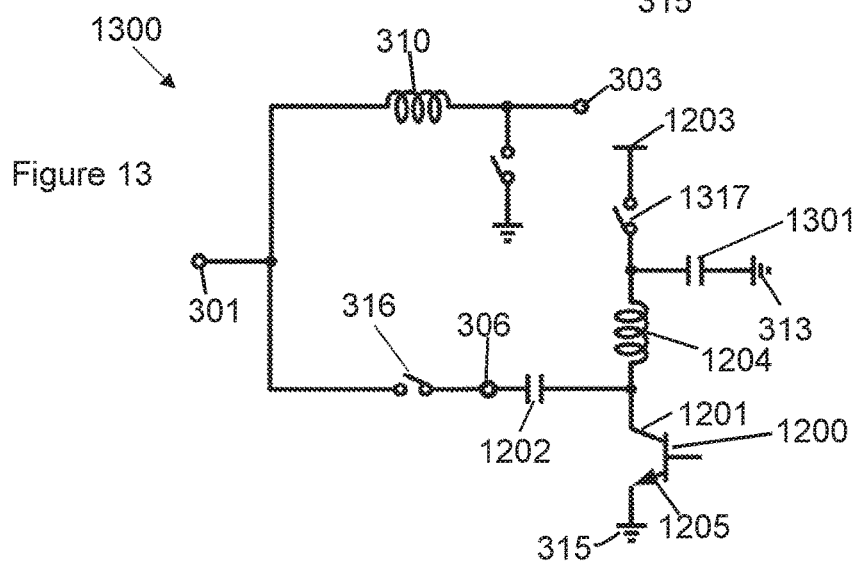
FIG. 13 shows a second example embodiment of the switch arrangement.

Example FIG. 13 shows a further example of the switch arrangement 1300. The same reference numerals have been used for like parts. In this example, the third semiconductor switch 317 is provided by a semiconductor switch 1317 configured to provide a switched connection between the power supply node 1203 and the transistor 1200. Thus, a first terminal of the switch 1317 is coupled to the power supply node 1203 and a second terminal of the switch 1317 is coupled to the transistor 1200 via the inductor 1204. In one or more examples a first plate of a decoupling capacitor 1301 may be coupled in parallel to a node between the second terminal of the switch 1317 and the inductor 1204. A second plate of the decoupling capacitor 1301 may be for coupling to a reference voltage, such as ground 315.

In one or more examples, by providing the third semiconductor switch as the power supply switch 1317, insertion losses may be reduced. Further, in one or more examples, the third switch 317 may limit the receive path output voltage swing headroom. Thus, by providing the third switch as power supply switch 1317, this may increase the limit of the output power from the receive path.

In the above example, the transistor 1200 may comprise a transistor of any one of the following types; npn common-emitter; a common-base or cascode stage; a nmos common-source; a common-gate or cascode stage; a pnp emitter follower; and a pmos source follower.

Figure 14:
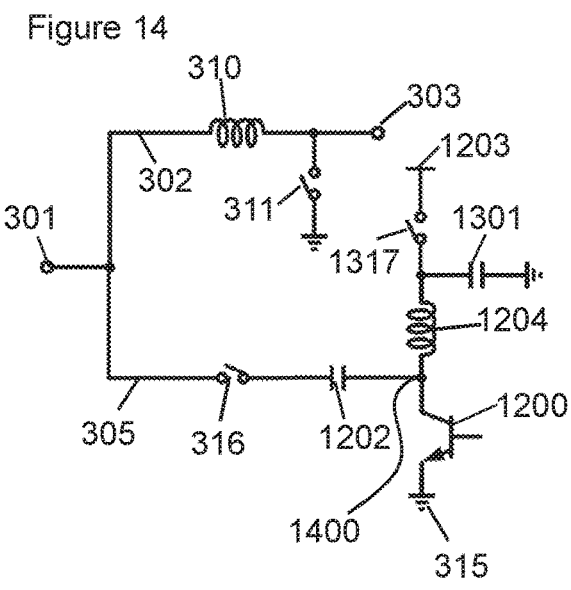
FIG. 14 shows the switch arrangement of FIG. 13 in the first switch mode.
Figure 15:
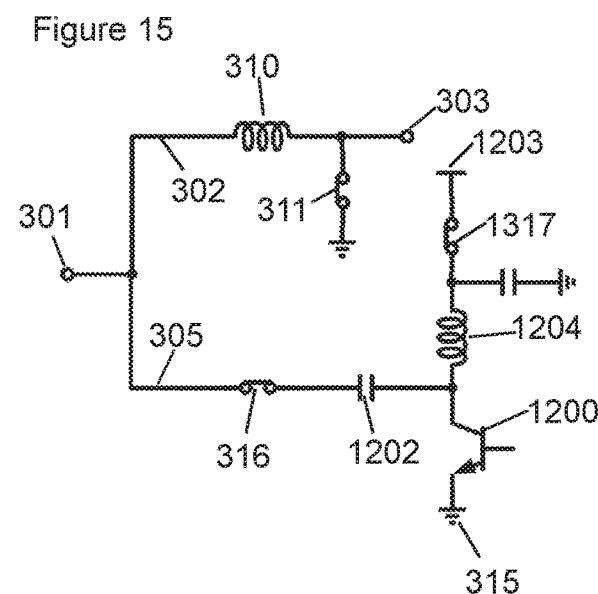
FIG. 15 shows the switch arrangement of FIG. 13 in the second switch mode.

Example FIGS. 14 and 15 show the status of the first, second and third semiconductor switches 311, 316 and 1317 in the first and second switch modes respectively.

In the first switch mode, depicted in example FIG. 14, the first semiconductor switch 311 and the second semiconductor switch 316 are open. In this and one or more other examples, the third semiconductor switch 1317 is open and, accordingly, the power supply node 1203 is disconnected or decoupled from the amplifier or transistor 1200. Accordingly, the transistor 1200 is pushed into forward saturation mode to make a short termination to the reference voltage, ground 315. The impedance at node 1400 and therefore the receive node 306 is approximately 0 Ohms. Thus, the receive node is shorted to ground and there is no impedance matching between the transceiver node 301 and the receive node 306/node 1400. The principle is then the same as described in relation to FIG. 4 and FIG. 5. A CLC network is formed of the capacitance of the open first semiconductor switch 311 plus the inductor 310 plus the capacitance of the open second semiconductor switch 316, which is also coupled to the reference voltage through transistor 1200 ($C_{off1}$+series L+$C_{off2}$). The CLC network or, more generally the switch arrangement 1300, transforms impedance $Z_0$ at the transceiver node to $Z_0$ at the transmit node 303. The signalling will thereby flow from the transceiver node 301 to the transmit node 303 (the impedance matched path) rather than from the receive node 306 to the transceiver node 301 (the non-impedance matched path).

In the second switch mode, depicted in example FIG. 15, the first semiconductor switch 311 and the second semiconductor switch 316 are closed. In this and one or more other examples, the third semiconductor switch 1317 is closed and, accordingly, the power supply node is coupled to the amplifier or transistor 1200. Accordingly, the transistor 1200 is active. In this example, the transmit node 303 is shorted to the reference voltage by the closed first semiconductor switch 311 and therefore is not impedance matched with the transceiver node 301. In this and one or more examples, the inductor 310 and the inductor 1204 form part of a receive path output matching network. In particular, in this and other examples, a parallel LC tank network is formed but with the two inductors 310 and 1204 rather than the single inductor of the previous example. The parallel LC tank network, in this and other examples, acts to tune out the output capacitance that is inherent in the buffer transistor 1200 to provide impedance matching between the transceiver node 301 and the receive node 306 and thus the amplifier 1200.

The signalling will thereby flow from the receive node 306 to the transceiver node 301 (the impedance matched path) rather than from the transceiver node 301 to the transmit node 303 (the non-impedance matched path).

Thus, to summarise the example of FIGS. 12 to 15, the switch arrangement 1300 comprises a third semiconductor switch 1317 that comprises part of an amplifier arrangement coupled with the receive node 306 of the receive path 305. The third semiconductor switch 1317 is configured to control the application of a supply voltage to an amplifier 1200, wherein in the first switch mode the third switch is open and a connection between the receive path 305 and a reference voltage, such as ground 315, is provided through the amplifier 1200. In the second switch mode, the third semiconductor switch 1317 is closed and the amplifier is provided with the supply voltage. Accordingly, the inductor 1204 and inductor 310 act to provide impedance matching between the transceiver node 301 and the amplifier 1200 of the receive path 305.

Figure 16:
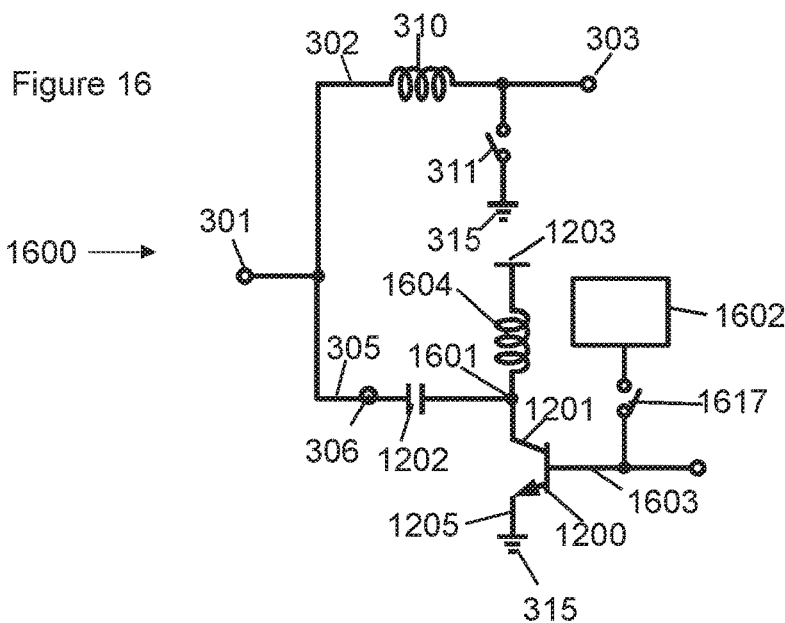
FIG. 16 shows a third example embodiment of the switch arrangement.

Example FIG. 16 shows a further example of a switch arrangement 1600, which is similar to the switch arrangement 1300 of FIG. 13. In the example switch arrangement 1600 of FIG. 16, the second switch 316 is absent and a further semiconductor switch 1617 provides the function of the second and third semiconductor switches 316, 1317 in the previous examples. The differences over the switch arrangement 1300 will now be described.

The example switch arrangement 1600 includes an amplifier arrangement comprising a series arrangement of a supply node 1203 for receiving a supply voltage, a further inductor 1604, a npn transistor 1200 comprising a collector terminal 1201 coupled with the inductor 1204 and an emitter terminal 1205 for connection to the reference voltage 315. The receive node 306 in this example is coupled to a node 1601 between the inductor 1604 and the collector terminal 1201 via a DC blocking capacitor 1202. Accordingly, when considering the flow of RF signalling the DC blocking capacitor 1202 may be ignored. The amplifier arrangement 1600, in this example, further comprises a bias circuit 1602 coupled to a base terminal 1603 of the transistor 1200 and configured to apply a bias voltage to the base terminal 1603. The application of the bias voltage is controlled by the further semiconductor switch 1617. The amplifier comprises a npn transistor, although could be embodied as a transistor of any one of the following types: npn common-emitter; a common-base or cascode stage; a nmos common-source; a common-gate or cascode stage; a pnp emitter follower; and a pmos source follower.

Figure 17:
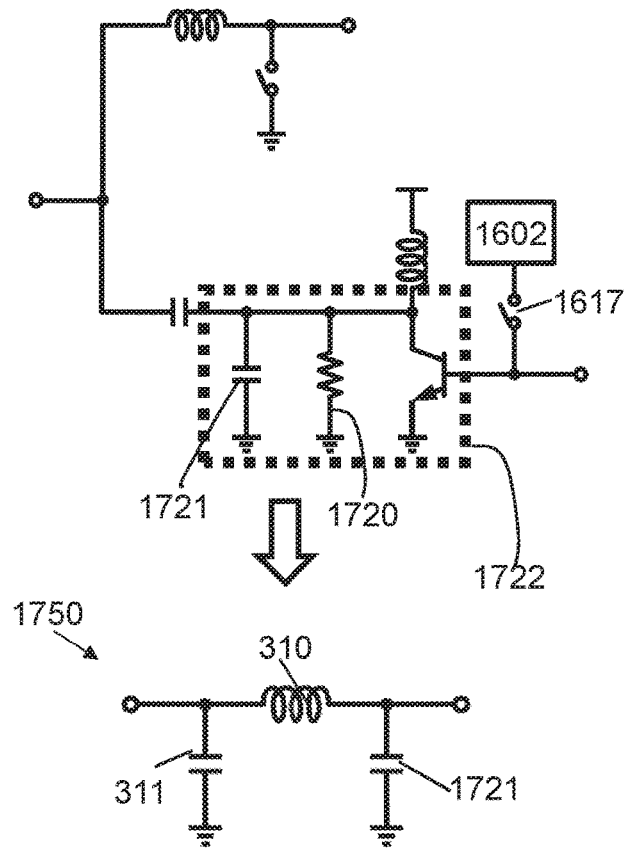
FIG. 17 shows the third example in a first switch mode.

In this and one or more examples, with reference to example FIG. 17, in the first switch mode, the further semiconductor switch 1617 is open and the bias voltage is not applied to the base terminal 1603. The first semiconductor switch 311 is also open and thus provides a capacitance. In FIG. 17, the box 1722 is shown to demonstrate that the transistor 1200 has an intrinsic capacitance 1721 and an intrinsic resistance 1720. Thus, components 1720 and 1721 are not distinct components but representations of the electrical properties of the transistor 1200. The same box 1722 is shown in example FIG. 18.

Figure 18:
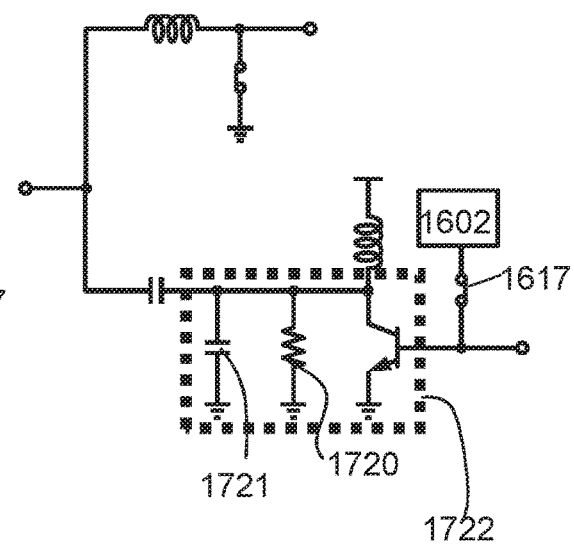
FIG. 18 shows the third example in a second switch mode.

In this and one or more examples, with reference to example FIG. 18, in the second switch mode, the further semiconductor switch 1617 is closed and the bias voltage is applied to the base terminal 1603. The first semiconductor switch 311 is closed and thus connects the transmit node 303 of the first branch 302 to the reference voltage 315.

As mentioned, example FIGS. 17 and 18 show an intrinsic resistance of the transistor 1200 as resistor 1720 with given resistance value $R_{out}$. Example FIGS. 17 and 18 also show an intrinsic capacitance of the transistor 1200 as capacitor 1721 with given capacitance Cow.

In the example of FIGS. 16-18, the inductor 310 has inductance $$L_1 = \frac{Z_0}{\omega}$$

Further, the capacitance of the first switch when in the open state is $$C_{off} = \frac{1}{\omega Z_0}$$

The inductance of the inductor 1204 is $L_2$.

In first switch mode, the bias current is not applied to the amplifier transistor 1200 and therefore the collector current (bias current) of the transistor 1200, lc=0. Further, the transconductance of the transistor 1200, gm, is also substantially zero, because for the npn transistor gm=lc/$V_T$, where $V_T$ is the thermal voltage which is ≈25 mV at 25° C. Accordingly, $R_{out}$ becomes very large (almost open).

The input impedance of second branch 305 is therefore:

$$Z_{in\_2nd\_branch} = \frac{1}{j\omega C_{out} + \frac{1}{j\omega L_2}} = -jZ_0 = \frac{1}{j\omega C_{off}}$$

So, the switch arrangement 1600 can be simplified to a CLC network 1750 wherein the capacitance is provided by the open first semiconductor switch 311, the inductance by the inductor 310 and the other capacitance by the intrinsic capacitance 1721 of the transistor 1200. Thus, impedance matching is provided between the transceiver node 310 and the transmit node 303 or, more generally, the one of the transmit node and receive node of the first branch.

In the second switch mode, the bias current is applied to the amplifier transistor 1200 and therefore:

$$R_{out} = \frac{V_{early}}{I_c} \mathbin{//} \frac{C_{fb} + C_{in}}{C_{fb} \times g_m},$$

wherein $V_{early}$ is the early voltage of transistor, $C_{fb}$ is the feedback capacitance from transistor output to input, $C_{in}$ is the input capacitance of transistor, gm is the transconductance of the transistor 1200 and Ic is the collector (bias) current of transistor.

Thus, $R_{out}$ is dependent on the current through the transistor 1200 and in the second switch mode the resistance 1720 or $R_{out}$ is low, such as around 100 Ohms.

Cout is assumed to be constant

In the second switch mode L1 (the inductance of the inductor 310) in parallel with L2 (the inductance of the inductor 1204) should be configured to tune out the $C_{out}$ of transistor:

$$j\omega C_{out} + \frac{1}{j\omega L_1} + \frac{1}{j\omega L_2} = 0$$

Therefore, the switch arrangement in the second switch mode provides for shorting of the transmit node 303 (i.e. one of the transmit and receive nodes) to the reference voltage by the first semiconductor switch 311. Further, the switch arrangement 1600 in the second switch mode provides a parallel LC tank circuit formed, in this example, of both inductors 310 and 1604 in parallel and the intrinsic junction capacitance of the transistor 1200 shown as 1721.

Cout is the mainly from the junction capacitance of npn transistor, so it is not particularly tunable. The inductors 310, 1604, namely L1 and L2 are configured to tune out Cout in the second switch mode to provide the impendence matching between the transceiver node 301 and the receive node 306/transistor 1200.

The value of L1 is determined by requirements of the CLC network formed in the first switch mode for which:

$$L_1 = \frac{Z_O}{\omega}$$

Since L1 is determined and Cout is known, L2 can be calculated accordingly.

As explained with reference to the known arrangement of FIG. 2, known switch arrangements of differential type are known. Example FIGS. 19 and 20 comprise examples of a switch arrangement 1900, 2000 of differential type with a reduced number of inductors, consistent with the switch arrangement 300 of example FIG. 3. Thus, the layout of the arrangements 1900, 2000 is broadly in line with the example arrangement 300 of FIG. 3.

Figure 19:
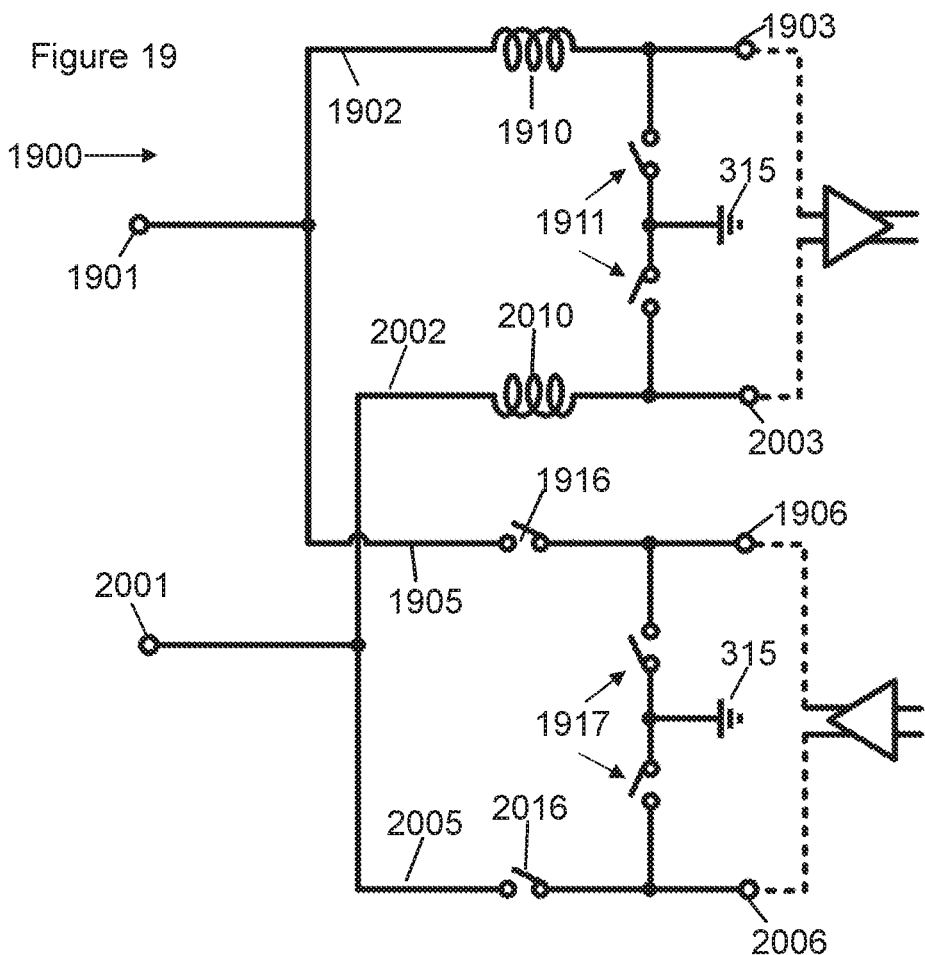
FIG. 19 shows a third example embodiment of the switch arrangement.

With reference to example FIG. 19, an example differential switch arrangement 1900 is shown. The arrangement 1900 comprises a transceiver node which in this differential example comprises a positive transceiver node 1901 and a negative transceiver node 1902. Likewise, the transmit node comprises a positive transmit node 1903 and a negative transmit node 2003. Likewise, the receive node comprises a positive receive node 1906 and a negative receive node 2006.

In this and one or more other examples, the first circuit branch comprises a first positive circuit branch 1902 and a first negative circuit branch 2002 coupled to the respective positive and negative transmit nodes 1903, 2003. In this and one or more other examples, the inductor comprises a first inductor 1910 in the first positive circuit branch 1902 and a second inductor 2010 in the first negative circuit branch 2002, the first inductor 1910 is coupled in series between the positive transceiver node 1901 and the positive transmit node 1903 and the second inductor 2010 is coupled in series between the negative transceiver node 2001 and the negative transmit node 2003. In this and one or more other examples, the first semiconductor switch 1911 is in parallel with both the positive transmit node 1903 and the negative transmit node 2003. Further, in one or more examples, the first semiconductor switch 1911 comprises a pair of first semiconductor switches each for selectively coupling one of the first positive circuit branch 1902 and the first negative circuit branch 2002 to a reference voltage, such as ground 315.

In this and one or more other examples, the second circuit branch comprises a second positive circuit branch 1905 and a second negative circuit branch 2005 coupled to the respective positive and negative receive nodes 1906, and 2006. In this and one or more other examples, the second semiconductor switch 1916 comprises a pair of switches comprising a second-positive semiconductor switch 1916 and a second-negative semiconductor switch 2016, the second positive circuit branch 1905 includes the second-positive semiconductor switch 1916 coupled in series between the positive transceiver node 1901 and the positive receive node 1906 and the second negative circuit branch 2005 includes the second-negative semiconductor switch 2016 coupled in series between the negative transceiver node 2001 and the negative receive node 2006.

In this and one or more other examples, the third semiconductor switch 1917 is in parallel with both the positive receive node 1906 and the negative receive node 2006. Further, in this and one or more other examples, the third semiconductor switch 1917 comprises a pair of third semiconductor switches each for selectively coupling one of the second positive circuit branch 1905 and the second negative circuit branch 2005 to a reference voltage, such as ground 315.

It will be appreciated that in this and one or more other examples, the first positive circuit branch 1902 and a first negative circuit branch 2002 comprise a transmit branch and the second positive circuit branch 1905 and the second negative circuit branch 2005 comprise a receive branch. In other examples of any of the examples herein, the branch designated "first" may comprise the receive branch and the branch designated "second" may comprise the transmit branch.

In the example switch arrangement 1900 of FIG. 19, the first semiconductor switch 1911 comprises a pair of first semiconductor switches, wherein a first of the pair is configured to provide a switched connection to a reference voltage for the first positive circuit branch 1902 and a second of the pair is configured to provide a switched connection to the reference voltage for the first negative circuit branch 2002.

Figure 20:
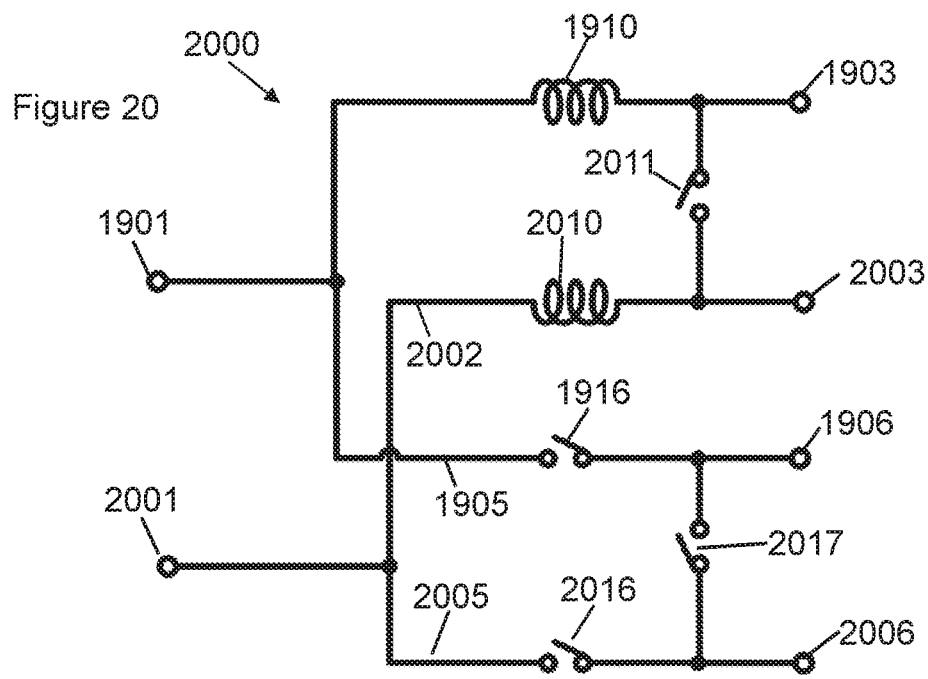
FIG. 20 shows a fourth example embodiment of the switch arrangement.
Figure 21:
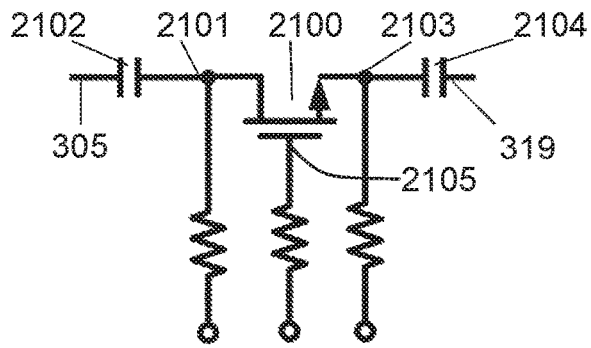
FIG. 21 shows a first example embodiment of a second semiconductor switch.

FIG. 20 shows an example switch arrangement 2000. The example switch arrangement 2000 of FIG. 20 is substantially the same as that of FIG. 19 and the same reference numerals have been used for like parts. In this example, however, the first semiconductor switch 2011 is configured to provide a switched connection between the first positive circuit branch 1902 and the first negative circuit branch 2002. Further in this and one and more other examples, the third semiconductor switch 2017 is configured to provide a switched connection between the second positive circuit branch 1905 and the second negative circuit branch 2005.

The operation of the switch arrangement 1900, 2000 in terms of the first and second switching modes is similar to the example described in relation to FIGS. 4 to 7. In particular, in the first switch mode, the first semiconductor switch 1911, 2011 or pair of first semiconductor switches 1911 are open and therefore provide a capacitance, similar to example FIG. 5. In the first switch mode, the second semiconductor switches 1916, 2016 are open and therefore provide a capacitance, similar to example FIG. 5. Further, in the first switch mode, the third semiconductor switch 1917, 2017 or pair of third semiconductor switches 1917 are closed and therefore provide a coupling to ground 315 or short the second positive and second negative branches 1902, 2002.

In the second switch mode, the first semiconductor switch 1911, 2011 or pair of first semiconductor switches 1911 are closed and provide a coupling to ground 315 or short the first positive and first negative branches 1902, 2002. In the second switch mode, the second semiconductor switches 1916, 2016 are closed. Further, in the second switch mode, the third semiconductor switch 1917, 2017 or pair of third semiconductor switches 1917 are open and therefore provide a capacitance between the corresponding branch and ground 315 or between the second positive and second negative branches 1905, 2005.

The effect of the switch arrangement in each of the first switch mode and the second switch mode is the same as previously described in relation to the other examples.

In the first switch mode the switch arrangement 1900, 2000 provides for substantially matching of the impendence between the positive transceiver node 1901 and the positive transmit node 1903 and for substantially matching of the impendence between the negative transceiver node 2001 and the negative transmit node 2003. In the first switch mode, the impedance between the positive transceiver node 1901 and the positive receive node 1906 and the impendence between the negative transceiver node 2001 and the negative receive node 2006 is substantially unmatched.

In the second switch mode the switch arrangement 1900, 2000 provides for substantially matching of the impendence between the positive transceiver node 1901 and the positive receive node 1906 and for substantially matching of the impendence between the negative transceiver node 2001 and the negative receive node 2006. In the second switch mode, the impedance between the positive transceiver node 1901 and the positive transmit node 1903 and the impendence between the negative transceiver node 2001 and the negative transmit node 2003 is substantially unmatched.

Figure 25:
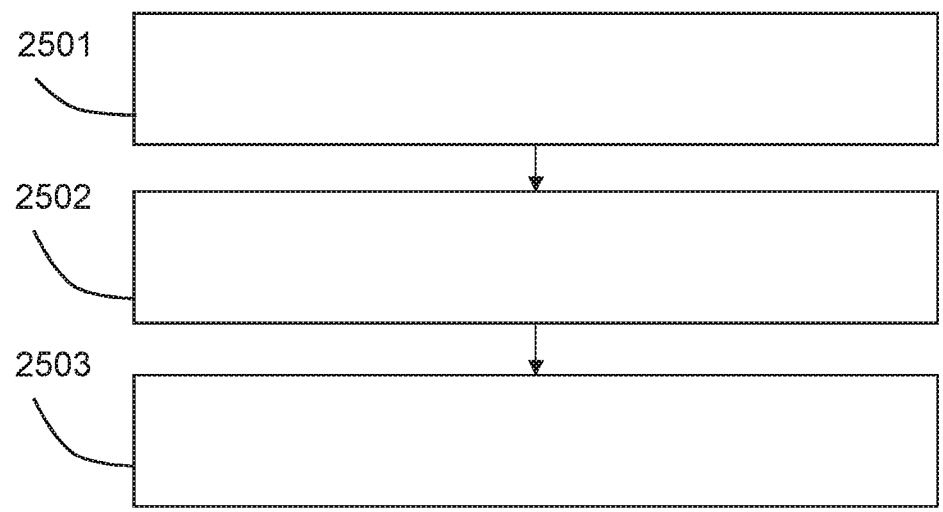
FIG. 25 shows an example method of operation of the switch arrangement.

Example FIG. 25 shows a method of operating a switch arrangement 300, 1300, 1600, 1900, 2000, wherein, the method comprises switching between:

a first switch mode 2501 in which the first semiconductor switch is open and thereby configured to provide a capacitance in parallel with the inductor and the one of the second and third semiconductor switches or the further semiconductor switch are configured to provide a capacitance coupled in parallel between the inductor and the reference voltage for substantially providing for impedance matching between the transceiver node and the one of the transmit node and the receive node; and a second switch mode 2502 in which the first semiconductor switch is closed and thereby couples the inductor and the one of the transmit node and the receive node to the reference voltage and the one of the second and third semiconductor switches or the further semiconductor switch are configured to couple the inductor, in parallel, to the reference voltage via a capacitance for substantially providing for impedance matching between the transceiver node and the other of the transmit node and the receive node.

Optionally, the example method comprises switching back to the first switch mode at 2503.

Figure 26:
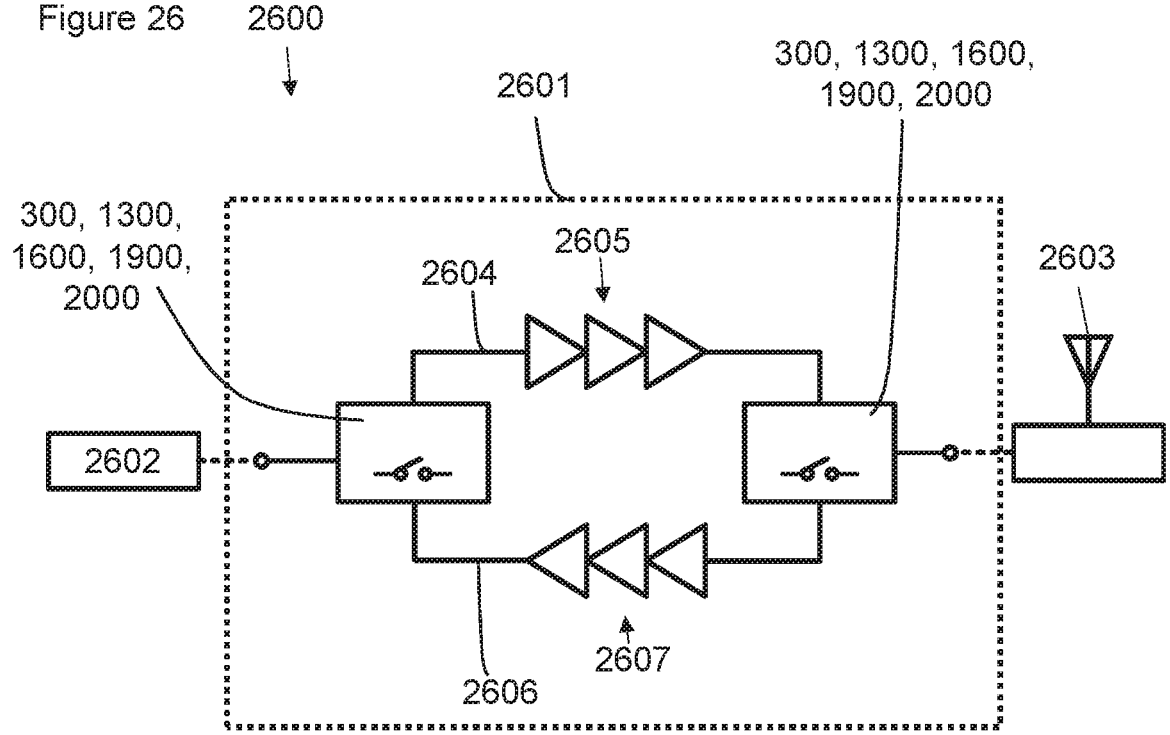
FIG. 26 shows an example communication device.

FIG. 26 shows a communication device 2600 comprising an RF front-end integrated circuit 2601, a transceiver 2602, and an antenna. It will be appreciated that the communication device may include further components connected to the transceiver 2602. The front-end integrated circuit comprises two instances of the switch arrangement 300, 1300, 1600, 1700 to control the flow of signalling between the transceiver 2602 and the antenna 2603 over either a transmit path 2604 comprising one or more amplifiers 2605 and a receive path 2606 comprising one or more amplifiers 2607. It will be appreciated that in general the device 2600 includes one or more antennas 2603 coupled to the transmit node and receive node via one or more amplifiers and one or more signal processing elements, such as transceiver 2602, for providing communication functionality, coupled to the transceiver node, the switch modes operable to provide for half-duplex transmission and reception of signalling by the telecommunication device 2600. The signal processing element 2202 may provide for processing of signalling for transmission and signalling that is received.

In the example of FIG. 26, two switch arrangements are shown but in other examples only one (or another number) is present.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A switch arrangement comprising:
a transceiver node for coupling to a transceiver for receiving signalling for transmission and for providing received signalling based on the switch arrangement being in a first switch mode or a second switch mode, the transceiver node coupled to a first circuit branch and a second circuit branch, the first circuit branch including one of a transmit node for connection to a transmit path and a receive node for connection to receive path, the second circuit branch including the other of the transmit node and the receive node;
wherein the first circuit branch comprises an inductor coupled in series between the transceiver node and the one of the transmit node and the receive node, and a first semiconductor switch coupled to the one of the transmit node and the receive node and in parallel therewith, and the first semiconductor switch configured to provide a switched coupling to a reference voltage; and
wherein the second circuit branch comprises one of:
i) a second semiconductor switch coupled in series between the transceiver node and the other of the transmit node and the receive node, and a third semiconductor switch coupled to the other of the transmit node and the receive node and in parallel therewith; and
ii) a second semiconductor switch coupled in series between the transceiver node and the other of the transmit node and the receive node, an amplifier coupled to the other of the transmit node and the receive node, and a third semiconductor switch configured to control the application of a supply voltage to the amplifier to control the coupling of the other of the transmit node and the receive node to the reference voltage through the amplifier; and
iii) an amplifier coupled to the other of the transmit node and the receive node and a further semiconductor switch configured to control the application of a bias current to the amplifier to control the coupling of the other of the transmit node and the receive node to the reference voltage through the amplifier;
wherein, in the first switch mode, the first semiconductor switch is open and thereby configured to provide a capacitance in parallel with the inductor and the one of the second and third semiconductor switches or the further semiconductor switch are configured to provide a capacitance coupled in parallel between the inductor and the reference voltage for substantially providing for impedance matching between the transceiver node and the one of the transmit node and the receive node; and
wherein, in the second switch mode, the first semiconductor switch is closed and thereby couples the inductor and the one of the transmit node and the receive node to the reference voltage and the one of the second and third semiconductor switches or the further semiconductor switch are configured to couple the inductor, in parallel, to the reference voltage via a capacitance for substantially providing for impedance matching between the transceiver node and the other of the transmit node and the receive node.

2. The switch arrangement of claim 1, wherein the second circuit branch is absent of an inductor.

3. The switch arrangement of claim 2, wherein
in the first switch mode, the semiconductor switches provide for formation of a CLC circuit in the first and second branches configured to substantially provide for impedance matching between the transceiver node and the one of the transmit node and the receive node; and
in the second switch mode, the semiconductor switches provide for formation of a parallel LC tank circuit in the first and second branches configured to substantially provide for impedance matching between the transceiver node and the other of the transmit node and the receive node.

4. The switch arrangement of claim 1, wherein
in the first switch mode, the semiconductor switches provide for formation of a CLC circuit in the first and second branches configured to substantially provide for impedance matching between the transceiver node and the one of the transmit node and the receive node; and
in the second switch mode, the semiconductor switches provide for formation of a parallel LC tank circuit in the first and second branches configured to substantially provide for impedance matching between the transceiver node and the other of the transmit node and the receive node.

5. The switch arrangement of claim 4, wherein the third semiconductor switch is configured to provide a switched connection to a reference voltage and wherein in the first mode, the third semiconductor switch is configured to be closed and in the second mode the third switch is configured to be open.

6. The switch arrangement of claim 4, wherein the third semiconductor switch comprises part of an amplifier arrangement, and the third semiconductor switch is configured to control the application of a supply voltage to an amplifier, wherein in the first mode the third switch is open and an amplifier of the amplifier arrangement is configured to provide a coupling to a reference voltage through the amplifier, and wherein, in the second mode, the third switch is closed and the amplifier is provided with the supply voltage.

7. The switch arrangement of claim 4, wherein the switch arrangement includes, coupled to the other of the transmit node and the receive node, an amplifier arrangement comprises a series arrangement of a supply node for receiving a supply voltage, a further inductor, a npn transistor comprising a collector terminal coupled with the inductor and an emitter terminal for connection to the reference voltage, the other of the transmit node and the receive node coupled to a node between the inductor and the collector terminal via a DC blocking capacitor, the amplifier arrangement further comprising a bias circuit coupled to a base terminal of the transistor and configured to apply a bias current to the base terminal, the application of the bias current controlled by the further semiconductor switch;
   wherein in the first switch mode the further semiconductor switch is open and the bias voltage is not applied to the base terminal; and
   wherein in the second switch mode the further semiconductor switch is closed and the bias voltage is applied to the base terminal.

8. The switch arrangement of claim 4, wherein
the first circuit branch comprises a transmit branch and couples to the transmit node;
the second circuit branch comprises a receive branch and couples to the receive node;
the first switch mode comprises a transmit mode which provides for impedance matching between transceiver node and the transmit node thereby providing for signalling to pass from the transceiver node to the transmit node; and
the second switch mode comprises a receive mode which provides for impedance matching between transceiver node and the receive node thereby providing for signalling to pass from the receive node to the transceiver node.

9. The switch arrangement of claim 1, wherein the third semiconductor switch is configured to provide a switched connection to a reference voltage and wherein in the first mode, the third semiconductor switch is configured to be closed and in the second mode the third switch is configured to be open.

10. The switch arrangement of claim 1, wherein the third semiconductor switch comprises part of an amplifier arrangement, and the third semiconductor switch is configured to control the application of a supply voltage to an amplifier, wherein in the first mode the third switch is open and an amplifier of the amplifier arrangement is configured to provide a coupling to a reference voltage through the amplifier, and wherein, in the second mode, the third switch is closed and the amplifier is provided with the supply voltage.

11. The switch arrangement of claim 10, wherein the amplifier arrangement comprises a series arrangement of a supply node for receiving the supply voltage, the third semiconductor switch configured to control the application of the supply voltage to the amplifier, comprising a npn transistor, through a further inductor, the npn transistor comprising a collector terminal coupled with the further inductor and an emitter terminal for connection to the reference voltage, the other of the transmit node and the receive node coupled between the further inductor and the collector terminal of the npn transistor, the amplifier arrangement further comprising a decoupling capacitor having a first plate coupled to a node between the third semiconductor switch and the inductor and a second plate for connection to the reference voltage.

12. The switch arrangement of claim 1, wherein the switch arrangement includes, coupled to the other of the transmit node and the receive node, an amplifier arrangement comprises a series arrangement of a supply node for receiving a supply voltage, a further inductor, a npn transistor comprising a collector terminal coupled with the inductor and an emitter terminal for connection to the reference voltage, the other of the transmit node and the receive node coupled to a node between the inductor and the collector terminal via a DC blocking capacitor, the amplifier arrangement further comprising a bias circuit coupled to a base terminal of the transistor and configured to apply a bias current to the base terminal, the application of the bias current controlled by the further semiconductor switch;
   wherein in the first switch mode the further semiconductor switch is open and the bias voltage is not applied to the base terminal; and
   wherein in the second switch mode the further semiconductor switch is closed and the bias voltage is applied to the base terminal.

13. The switch arrangement of claim 1, wherein
the first circuit branch comprises a transmit branch and couples to the transmit node;
the second circuit branch comprises a receive branch and couples to the receive node;
the first switch mode comprises a transmit mode which provides for impedance matching between transceiver node and the transmit node thereby providing for signalling to pass from the transceiver node to the transmit node; and
the second switch mode comprises a receive mode which provides for impedance matching between transceiver node and the receive node thereby providing for signalling to pass from the receive node to the transceiver node.

14. The switch arrangement of claim 1, wherein the switch arrangement comprises a differential switch arrangement, and the transceiver node comprises a positive transceiver node and a negative transceiver node, the transmit node comprises a positive transmit node and a negative transmit node, and the receive node comprises a positive receive node and a negative receive node;
   wherein the first circuit branch comprises a first positive circuit branch and a first negative circuit branch coupled to the respective positive and negative transmit nodes, and wherein the inductor comprises a first inductor in the first positive circuit branch and a second inductor in the first negative circuit branch, the first inductor coupled in series between the positive transceiver node and the positive transmit node and the second inductor coupled in series between the negative transceiver node and the negative transmit node, and the first semiconductor switch is in parallel with both the positive transmit node and the negative transmit node; and
   wherein the second circuit branch comprises a second positive circuit branch and a second negative circuit branch coupled to the respective positive and negative receive nodes, and wherein the second semiconductor switch comprises a pair of switches comprising a second-positive semiconductor switch and a second-negative semiconductor switch, the second positive circuit branch includes the second-positive semiconductor switch coupled in series between the positive transceiver node and the positive receive node and the second negative circuit branch includes the second-negative semiconductor switch coupled in series between the negative transceiver node and the negative receive node, and the third semiconductor switch is in parallel with both the positive receive node and the negative receive node.

15. The switch arrangement of claim 14, wherein one of:
the first semiconductor switch comprises a pair of first semiconductor switches, and a first of the pair is configured to provide a switched connection to a reference voltage for the first positive circuit branch and a second of the pair is configured to provide a switched connection to the reference voltage for the first negative circuit branch; and
the first semiconductor switch is configured to provide a switched connection configured to couple the first positive circuit branch and the first negative circuit branch.

16. The switch arrangement of claim 14, wherein one of:
the third semiconductor switch comprises a pair of third semiconductor switches each of the pair configured to provide a switched connection to a reference voltage for each of the second positive circuit branch and the second negative circuit branch; and
the third semiconductor switch is configured to provide a switched connection between the second positive circuit branch and the second negative circuit branch.

17. The switch arrangement of claim 1, wherein the first semiconductor switch and the third semiconductor switch comprise one of:
a MOS transistor having a drain terminal coupled to the respective transmit node and the receive node and a source terminal for connection to a reference voltage;
a reverse saturation mode npn transistor having a collector terminal coupled to the respective transmit node and the receive node and an emitter terminal for connection to a reference voltage;
a forward saturation mode npn transistor having an emitter terminal coupled to the respective transmit node and the receive node and a collector terminal for connection to a reference voltage; and
a pin diode having a cathode thereof coupled to the respective transmit node and the receive node and an anode thereof coupled to a reference voltage via a capacitor.

18. The switch arrangement of claim 1, wherein the switch arrangement is formed as an integrated circuit on a semiconductor die wherein the transceiver node, the transmit node and the receive node provide for connection to and from the semiconductor die.

19. A communication device including the switch arrangement of claim 1 including one or more antennas coupled to the transmit node and receive node via one or more amplifiers and a signal processing element for providing communication functionality coupled to the transceiver node, the switching modes operable to provide for half-duplex transmission and reception of signalling by the communication device.

20. A method of operating a switch arrangement, the switch arrangement comprising:
a transceiver node for coupling to a transceiver for receiving signalling for transmission and for providing received signalling based on the switch arrangement being in a first switch mode or a second switch mode, the transceiver node coupled to a first circuit branch and a second circuit branch, the first circuit branch including one of a transmit node for connection to a transmit path and a receive node for connection to receive path, the second circuit branch including the other of the transmit node and the receive node;
wherein the first circuit branch comprises an inductor coupled in series between the transceiver node and the one of the transmit node and the receive node, and a first semiconductor switch coupled to the one of the transmit node and the receive node and in parallel therewith, and the first semiconductor switch configured to provide a switched coupling to a reference voltage; and
wherein the second circuit branch comprises one of:
i) a second semiconductor switch coupled in series between the transceiver node and the other of the transmit node and the receive node, and a third semiconductor switch coupled to the other of the transmit node and the receive node and in parallel therewith; and
ii) a second semiconductor switch coupled in series between the transceiver node and the other of the transmit node and the receive node, an amplifier coupled to the other of the transmit node and the receive node, and a third semiconductor switch configured to control the application of a supply voltage to the amplifier to control the coupling of the other of the transmit node and the receive node to the reference voltage through the amplifier, via a capacitor; and
iii) an amplifier coupled to the other of the transmit node and the receive node and a further semiconductor switch configured to control the application of a bias current to the amplifier to control the coupling of the other of the transmit node and the receive node to the reference voltage through the amplifier;
wherein the method comprises adopting a first switch mode in which the first semiconductor switch is open and thereby configured to provide a capacitance in parallel with the inductor and the one of the second and third semiconductor switches or the further semiconductor switch are configured to provide a capacitance coupled in parallel between the inductor and the reference voltage for substantially providing for impedance matching between the transceiver node and the one of the transmit node and the receive node; and
wherein the method comprises adopting a second switch mode in which the first semiconductor switch is closed and thereby couples the inductor and the one of the transmit node and the receive node to the reference voltage and the one of the second and third semiconductor switches or the further semiconductor switch are configured to couple the inductor, in parallel, to the reference voltage via a capacitance for substantially providing for impedance matching between the transceiver node and the other of the transmit node and the receive node.

* * * * *